(12) United States Patent
Fan et al.

(10) Patent No.: US 11,783,740 B2
(45) Date of Patent: Oct. 10, 2023

(54) DISPLAY SUBSTRATE, MANUFACTURING METHOD THEREOF, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Cong Fan, Beijing (CN); Qi Liu, Beijing (CN); Fan He, Beijing (CN); Xiangdan Dong, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 279 days.

(21) Appl. No.: 17/418,235

(22) PCT Filed: Dec. 29, 2020

(86) PCT No.: PCT/CN2020/140706
§ 371 (c)(1),
(2) Date: Jun. 24, 2021

(87) PCT Pub. No.: WO2021/136242
PCT Pub. Date: Jul. 8, 2021

(65) Prior Publication Data
US 2023/0134900 A1      May 4, 2023

(30) Foreign Application Priority Data

Jan. 2, 2020 (CN) .......................... 202010000925.1

(51) Int. Cl.
*G09G 3/00* (2006.01)
*G09G 3/3225* (2016.01)
(Continued)

(52) U.S. Cl.
CPC .......... *G09G 3/006* (2013.01); *G09G 3/3225* (2013.01); *H10K 59/1201* (2023.02);
(Continued)

(58) Field of Classification Search
CPC .... G09G 3/006; G09G 3/3225; H10K 59/131; H10K 59/1201
See application file for complete search history.

(56) References Cited

U.S. PATENT DOCUMENTS

| 2011/0095290 A1 | 4/2011 | Koo et al. |
| 2014/0104741 A1 | 4/2014 | Oh et al. |
| 2019/0236993 A1 | 8/2019 | Wang et al. |

FOREIGN PATENT DOCUMENTS

| CN | 102053437 A | 5/2011 |
| CN | 108257540 A | 7/2018 |

(Continued)

OTHER PUBLICATIONS

PCT/CN2020/140706 international search report and written opinion.

*Primary Examiner* — Sardis F Azongha
(74) *Attorney, Agent, or Firm* — IPRO, PLLC

(57) ABSTRACT

A display substrate, a manufacturing method thereof, and a display device are provided. A first test signal line in a test circuit in the display substrate extends in a second direction, and a second test signal line includes a first part extending a the first direction and a second part extending in the second direction; a width of the second part of the second test signal line in a direction perpendicular to the second direction is different from a width of the first test signal line in the direction perpendicular to the second direction; a difference between a resistance of the first test signal line and a
(Continued)

resistance of the second test signal line the difference is less than a first threshold. The display substrate as provided is used for display.

20 Claims, 7 Drawing Sheets

(51) Int. Cl.
*H10K 59/12* (2023.01)
*H10K 59/131* (2023.01)

(52) U.S. Cl.
CPC ... *H10K 59/131* (2023.02); *G09G 2300/0426* (2013.01); *G09G 2330/12* (2013.01)

(56) References Cited

FOREIGN PATENT DOCUMENTS

| | | |
|---|---|---|
| CN | 108646483 A | 10/2018 |
| CN | 109188810 A | 1/2019 |
| CN | 210805177 U | 6/2020 |
| KR | 20060095693 A | 9/2006 |
| KR | 20080034546 A | 4/2008 |

DISPLAY SUBSTRATE, MANUFACTURING METHOD THEREOF, AND DISPLAY DEVICE

CROSS-REFERENCE TO RELATED APPLICATION

This application is the U.S. national phase of PCT Application No. PCT/CN2020/140706 filed on Dec. 29, 2020, which claims a priority to Chinese Patent Application No. 202010000925.1 filed in China on Jan. 2, 2020, the disclosures of which are incorporated in their entirety by reference herein.

TECHNICAL FIELD

The present disclosure relates to the field of display technology, and in particular to a display substrate, a manufacturing method thereof, and a display device.

BACKGROUND

Active-matrix organic light-emitting diode (AMOLED) display products are widely used in social life with their advantages such as self-illumination, high contrast, low power consumption, etc. However, compared with liquid crystal display products, the AMOLED display products are limited by complicated production process and low product yield, which results in generally high production cost of the AMOLED display products.

SUMMARY

The present disclosure provides a display substrate including: a display area and a non-display area at a periphery of the display area, where the display substrate further includes a test structure in the non-display area, the test structure includes multiple test circuits arranged along a first direction, and each of at least one test circuit of the multiple test circuits includes:

multiple test signal lines, where the multiple test signal lines include a first test signal line and a second test signal line, the first test signal line extends in a second direction, the second test signal line includes a first part extending in the first direction and a second part extending in the second direction, and the second direction intersects the first direction;

a width, of the second part of the second test signal line, in a direction perpendicular to the second direction is different from a width, of the first test signal line, in the direction perpendicular to the second direction, and a difference between a resistance of the first test signal line and a resistance of the second test signal line is smaller than a first threshold.

Optionally, a width, of the first part of the second test signal line, in a direction perpendicular to the first direction is the same as the width of the first test signal line in the direction perpendicular to the second direction.

Optionally, the width of the first part of the second test signal line in the direction perpendicular to the first direction is smaller than the width of the second part of the second test signal line in the direction perpendicular to the second direction; the width of the first test signal line in the direction perpendicular to the second direction is smaller than the width of the second part of the second test signal line in the direction perpendicular to the second direction.

Optionally, a wiring length of the second test signal line is greater than a wiring length of the first test signal line.

Optionally, the test circuit further includes a first test sub-circuit, and the first test sub-circuit includes:

a first test unit, where an orthographic projection of the first test unit onto a base of the display substrate is between an orthographic projection of the first test signal line onto the base and an orthographic projection of the second test signal line onto the base; an output terminal of the first test unit is coupled to the first test signal line, and is configured to output a first image test signal and a second image test signal to the first test signal line in a time division manner;

a second test unit, where an orthographic projection of the second test unit onto the base is on a side of the orthographic projection of the second test signal line onto the base that is away from the orthographic projection of the first test signal line onto the base; an output terminal of the second test unit is coupled to the second test signal line, and is configured to output a third image test signal to the second test signal line.

Optionally, the second test signal line includes a first conductive pattern, a second conductive pattern, a third conductive pattern, a fourth conductive pattern, and a fifth conductive pattern, a sixth conductive pattern and a seventh conductive pattern that are sequentially coupled;

the first part of the second test signal line includes the second conductive pattern, the fourth conductive pattern and the sixth conductive pattern, and the second part of the second test signal line includes the first conductive pattern, the third conductive pattern, the fifth conductive pattern and the seventh conductive pattern;

a first accommodating space is defined by the second conductive pattern, the third conductive pattern, the fourth conductive pattern, the fifth conductive pattern, the sixth conductive pattern and the first test signal line define, and at least part of the first test unit is in the first accommodating space.

Optionally, the test circuit further includes a second test sub-circuit, and the second test sub-circuit includes:

a third test unit, where an orthographic projection of the third test unit onto a base of the display substrate is between an orthographic projection of the first test signal line onto the base and an orthographic projection of the second test signal line onto the base; an output terminal of the third test unit is coupled to the first test signal line and the second test signal line, and is configured to output same functional test signals to the first test signal line and the second test signal line simultaneously.

Optionally, the second test signal line includes: an eighth conductive pattern, a ninth conductive pattern, a tenth conductive pattern, and an eleventh conductive pattern that are sequentially coupled;

the first part of the second test signal line includes the eighth conductive pattern and the tenth conductive pattern, and the second part of the second test signal line includes the ninth conductive pattern and the eleventh conductive pattern;

a third accommodating space is defined by the eighth conductive pattern, the ninth conductive pattern, the tenth conductive pattern and the first test signal line, and at least part of the third test unit is in the third accommodating space.

Optionally, the multiple test signal lines further include a third test signal line and a fourth test signal line, the third test signal line includes a third part extending in in the first direction and a fourth part extending in the second direction, and the fourth test signal line extends in the second direction;

a width, of the fourth part of the third test signal line, in a direction perpendicular to the second direction is different from a width, of the fourth test signal line, in the direction perpendicular to the second direction;

among the first test signal line, the second test signal line, the third test signal line and the fourth test signal line, a difference between resistances of any two test signal lines is less than a first threshold.

Optionally, the first test signal line, the second test signal line, the third test signal line, and the fourth test signal line are arranged along the first direction in sequence; the test circuit includes a first corner area, a second corner area and a third corner area, and the second test signal line includes the first part and the second part in each of the first corner area, the second corner area and the third corner area; and the third test signal line includes the third part and the fourth part in each of the second corner area and the third corner area.

Optionally, a width, of the third part of the third test signal line, in a direction perpendicular to the first direction is the same as the width of the fourth test signal line in the direction perpendicular to in the second direction.

Optionally, the width of the third part of the third test signal line in the direction perpendicular to the first direction is smaller than a width, of the fourth part of the third test signal line, in the direction perpendicular to the second direction;

the width of the fourth test signal line in the direction perpendicular to the second direction is smaller than the width of the fourth part of the third test signal line in the direction perpendicular to the second direction.

Optionally, a wiring length of the third test signal line is greater than a wiring length of the fourth test signal line.

Optionally, the width of the first test signal line in the direction perpendicular to the second direction is equal to the width of the fourth test signal line in the direction perpendicular to the second direction;

the width of the second part of the second test signal line in the direction perpendicular to the second direction and the width of the fourth part of the third test signal line in the direction perpendicular to the second direction are both larger than the width of the first test signal line in the direction perpendicular to the second direction.

Optionally, the test circuit further includes a first test sub-circuit, and the first test sub-circuit includes:

a fourth test unit, where an orthographic projection of the fourth test unit onto a base of the display substrate is between an orthographic projection of the second test signal line onto the base and an orthographic projection of the third test signal line on the base; an output terminal of the fourth test unit is coupled to the third test signal line, and is configured to output a first image test signal and a second image test signal to the third test signal line in a time division manner;

a fifth test unit, where an orthographic projection of the fifth test unit onto the base is between the orthographic projection of the third test signal line onto the base and an orthographic projection of the fourth test signal line onto the base; an output terminal of the fifth test unit is coupled to the fourth test signal line, and is configured to output a third image test signal to the fourth test signal line.

Optionally, the test circuit further includes a second test sub-circuit, and the second test sub-circuit includes:

a sixth test unit, where an orthographic projection of the sixth test unit onto the base is between the orthographic projection of the third test signal line onto the base and the orthographic projection of the fourth test signal line onto the base; an output terminal of the sixth test unit is coupled to the third test signal line and the fourth test signal line, and is configured to output same functional test signals to the third test signal line and the fourth test signal line simultaneously.

Optionally, the third test signal line includes a twelfth conductive pattern, a thirteenth conductive pattern, a fourteenth conductive pattern, a fifteenth conductive pattern, a sixteenth conductive pattern, a seventeenth conductive pattern, an eighteenth conductive pattern, a nineteenth conductive pattern and a twentieth conductive pattern that are sequentially coupled;

the third part of the third test signal line includes the thirteenth conductive pattern, the fifteenth conductive pattern, the seventeenth conductive pattern and the nineteenth conductive pattern, and the fourth part of the third test signal line includes the twelfth conductive pattern, the fourteenth conductive pattern, the sixteenth conductive pattern, the eighteenth conductive pattern and the twentieth conductive pattern;

a second accommodating space is defined by the fifteenth conductive pattern, the sixteenth conductive pattern, the seventeenth conductive pattern and the second test signal line define, and at least part of the second test unit is in the second accommodating space;

a fifth accommodating space is defined by the thirteenth conductive pattern, the fourteenth conductive pattern, the fifteenth conductive pattern and the fourth test signal line, and at least part of the fifth test unit is in the fifth accommodating space;

a sixth accommodating space is defined by the nineteenth conductive pattern, the twentieth conductive pattern and the fourth test signal line, and at least part of the sixth test unit is in the sixth accommodating space.

Optionally, the first test sub-circuit and the second test sub-circuit are arranged along the second direction, and the first test sub-circuit is between the display area and the second test sub-circuit.

Optionally, the test structure further includes: a first control signal line, a second control signal line, a third control signal line, a fourth control signal line, a fifth control signal line, a sixth control signal line and a seventh control signal line that all extend in the first direction; and a first test data line, a second test data line, a third test data line, a fourth test data line, a fifth test data line, a sixth test data line, a seventh test data line and an eighth test data line that all extend in the first direction;

the multiple test signal lines further includes a third test signal line and a fourth test signal line;

each of the test circuits includes a first test sub-circuit and a second test sub-circuit; the first test sub-circuit includes a first test unit, a second test unit, a fourth test unit and a fifth test unit; the second test sub-circuit includes a third test unit and a sixth test unit;

the first test unit includes a first transistor and a second transistor, a gate of the first transistor is coupled to the second control signal line, a first electrode of the first transistor is coupled to the third test data line, and a second electrode of the first transistor is coupled to the first test signal line;

a gate of the second transistor is coupled to the third control signal line, a first electrode of the second transistor is coupled to the fourth test data line, and a second electrode of the second transistor is coupled to the first test signal line;

the second test unit includes a third transistor, a gate of the third transistor is coupled to the fifth control signal line, a first electrode of the third transistor is coupled to the sixth test data line, and a second electrode of the third transistor is coupled to the second test signal line;

the fourth test unit includes a fourth transistor and a fifth transistor, a gate of the fourth transistor is coupled to the first control signal line, a first electrode of the fourth transistor is coupled to the first test data line, and a second electrode of the fourth transistor is coupled to the third test signal line;

a gate of the fifth transistor is coupled to the second control signal line, a first electrode of the fifth transistor is coupled to the second test data line, and a second electrode of the fifth transistor is coupled to the third test signal line;

the fifth test unit includes a sixth transistor, a gate of the sixth transistor is coupled to the fourth control signal line, a first electrode of the sixth transistor is coupled to the fifth test data line, and a second electrode of the sixth transistor is coupled to the fourth test signal line;

the third test unit includes a seventh transistor and an eighth transistor, a gate of the seventh transistor and a gate of the eighth transistor are both coupled to the sixth control signal line, a first electrode of the seventh transistor and a first electrode of the eighth transistor are both coupled to the seventh test data line, a second electrode of the seventh transistor is coupled to the first test signal line, and a second electrode of the eighth transistor is coupled to the second test signal line;

the sixth test unit includes a ninth transistor and a tenth transistor, a gate of the ninth transistor and a gate of the tenth transistor are both coupled to the seventh control signal line, a first electrode of the ninth transistor and a first electrode of the tenth transistor are both coupled to the eighth test data line, a second electrode of the ninth transistor is coupled to the third test signal line, and a second electrode of the tenth transistor is coupled to the fourth test signal line.

Optionally, the display substrate further includes:

multiple data signal lines in the display area, where the data signal lines respectively correspond to the test signal lines;

multiple fanout lines in the non-display area, where the fanout lines respectively correspond to the data signal lines, and the data signal line is coupled to the corresponding test signal line through the corresponding fanout line; the multiple fanout lines form multiple sub-fanout areas arranged along the first direction, and each of the multiple sub-fanout areas includes fanout lines;

multiple power signal line patterns, where an orthographic projection of each power signal line pattern onto a base of the display substrate is between orthographic projections of two adjacent sub-fanout areas onto the base; resistances of the fanout lines on a same side of a central axis of the display substrate gradually increase along a direction towards the central axis, a difference between resistances of any two adjacent fanout lines is smaller than a second threshold, and the central axis extends in a direction parallel to the second direction.

Optionally, each fanout line includes a first fanout pattern and a second fanout pattern that are coupled, the first fanout pattern is between the display area and the second fanout pattern, the first fanout pattern extends in the second direction, the second fanout pattern extends in a third direction, and the third direction intersects the second direction;

on a same side of the central axis and along the direction towards the central axis of the display substrate, widths of the first fanout patterns of the fanout lines in a same sub-fanout area gradually increase, and widths of the second fanout patterns of the fanout lines in the same sub-fanout area are the same;

on a same side of the central axis, for two adjacent sub-fanout areas, a width of the first fanout pattern that is farthest from the central axis in the sub-fanout area closer to the central axis, is greater than, a width of the first fanout pattern that is closest to the central axis in the sub-fanout area farther away from the central axis; a difference, between the width of the first fanout pattern that is farthest from the central axis in the sub-fanout area closer to the central axis and the width of the first fanout pattern that is closest to the central axis in the sub-fanout area farther away from the central axis, is greater than a third threshold;

the width of the first fanout pattern is a width of the first fanout pattern in the direction perpendicular to the second direction, and the width of the second fanout pattern is a width of the second fanout pattern in the direction perpendicular to the third direction.

The present disclosure also provides a display device including the above display substrate.

The present disclosure also provides a method for driving the above display substrate, the first test data line and the third test data line are configured to transmit the first image test signal; the second test data line and the fourth test data line are configured to transmit the second image test signal; the fifth test data line and the sixth test data line are configured to transmit the third image test signal; the seventh test data line and the eighth test data line are configured to transmit the functional test signals;

the method includes:

in a first test stage, under the control of a second control signal transmitted by the second control signal line, the first transistor is turned on, to write the first image test signal transmitted by the third test data line into the first test signal line; under the control of a first control signal transmitted by the first control signal line, the fourth transistor is turned on, to write the first image test signal transmitted by the first test data line into the third test signal line; under the control of a fifth control signal transmitted by the fifth control signal line, the third transistor is turned on, to write the third image test signal transmitted by the sixth test data line into the second test signal line;

in a second test stage, under the control of a third control signal transmitted by the third control signal line, the second transistor is turned on, to write the second image test signal transmitted by the fourth test data line into the first test signal line; under the control of a second control signal transmitted by the second control signal line, the fifth transistor is turned on, to write the second image test signal transmitted by the second test data line into the third test signal line; under the control of a fourth control signal transmitted by the fourth control signal line, the sixth transistor is turned on, to write the third image test signal transmitted by the fifth test data line into the fourth test signal line;

in a third test stage, under the control of a sixth control signal transmitted by the sixth control signal line, the seventh transistor and the eighth transistor are turned on, to write the functional test signal transmitted by the seventh test data line into the first test signal line and the second test signal line; under the control of a seventh control signal transmitted by the seventh control signal line, the ninth transistor and the tenth transistors are turned on, to write the functional test signal transmitted by the eighth test data line into the third test signal line and the fourth test signal line.

The present disclosure also provides a manufacturing method of a display substrate, for manufacturing the above display substrate, and the manufacturing method includes:

manufacturing a test structure in a non-display area of the display substrate, the test structure includes multiple test circuits arranged along a first direction, and each of at least one test circuit of the multiple test circuits includes: multiple test signal lines, the multiple test signal lines include a first test signal line and a second test signal line, the first test signal line extends in a second direction, the second test signal line includes a first part extending in the first direction and a second part extending in the second direction, and the second direction intersects the first direction; a width, of the second part of the second test signal line, in a direction perpendicular to the second direction is different from a width, of the first test signal line, in the direction perpendicular to the second direction, and a difference between a resistance of the first test signal line and a resistance of the second test signal line is smaller than a first threshold.

BRIEF DESCRIPTION OF THE DRAWINGS

The drawings described herein are used to provide a further understanding of the present disclosure and form a part of the present disclosure. The exemplary embodiments of the present disclosure and their descriptions are used to explain the present disclosure, and do not constitute an improper limitation of the present disclosure. In the attached drawings.

DETAILED DESCRIPTION

In order to further explain the display substrate, the manufacturing method thereof, and the display device provided by the embodiments of the present disclosure, detailed descriptions are provided hereinafter in conjunction with the accompanying drawings of the specification.

In order to improve the production yield of AMOLED display products, in related technologies, a test circuit is generally provided in a display product, and performance of the intermediate product obtained during the production process can be tested in time via the test circuit, which not only helps solve the problem of product defects in time, but also facilitates improvement of the production yield of products. In addition, production time is saved, production costs are reduced, and efficiency is improved.

However, in the related technologies, in a case that a test circuit is used to test a display product, when same test signals are provided to a display area of the display product via the test circuit, uniformity of the test signals received by the display area of the display product is poor, which affects accuracy of testing the display product.

Based on the problem in the above, inventors of the present disclosure discover through research that the reason for the poor uniformity of the test signals received by the display area of the display product is that: differences among resistances of test signal lines included in the test circuit are relatively large, resulting in relatively large differences in voltage drops of test signal lines; as a result, when same test signals are provided to the display area of the display product via the test circuit, the uniformity of the test signals received by the display area of the display product is poor, which affects the accuracy of testing the display product.

The present disclosure is to provide a display substrate, a manufacturing method thereof, and a display device, which are used to solve the problem of low accuracy of display product test caused by poor uniformity of the test signals received by the display area of the display product when the display product is tested by using the test circuit in the related technologies.

Figure 1:
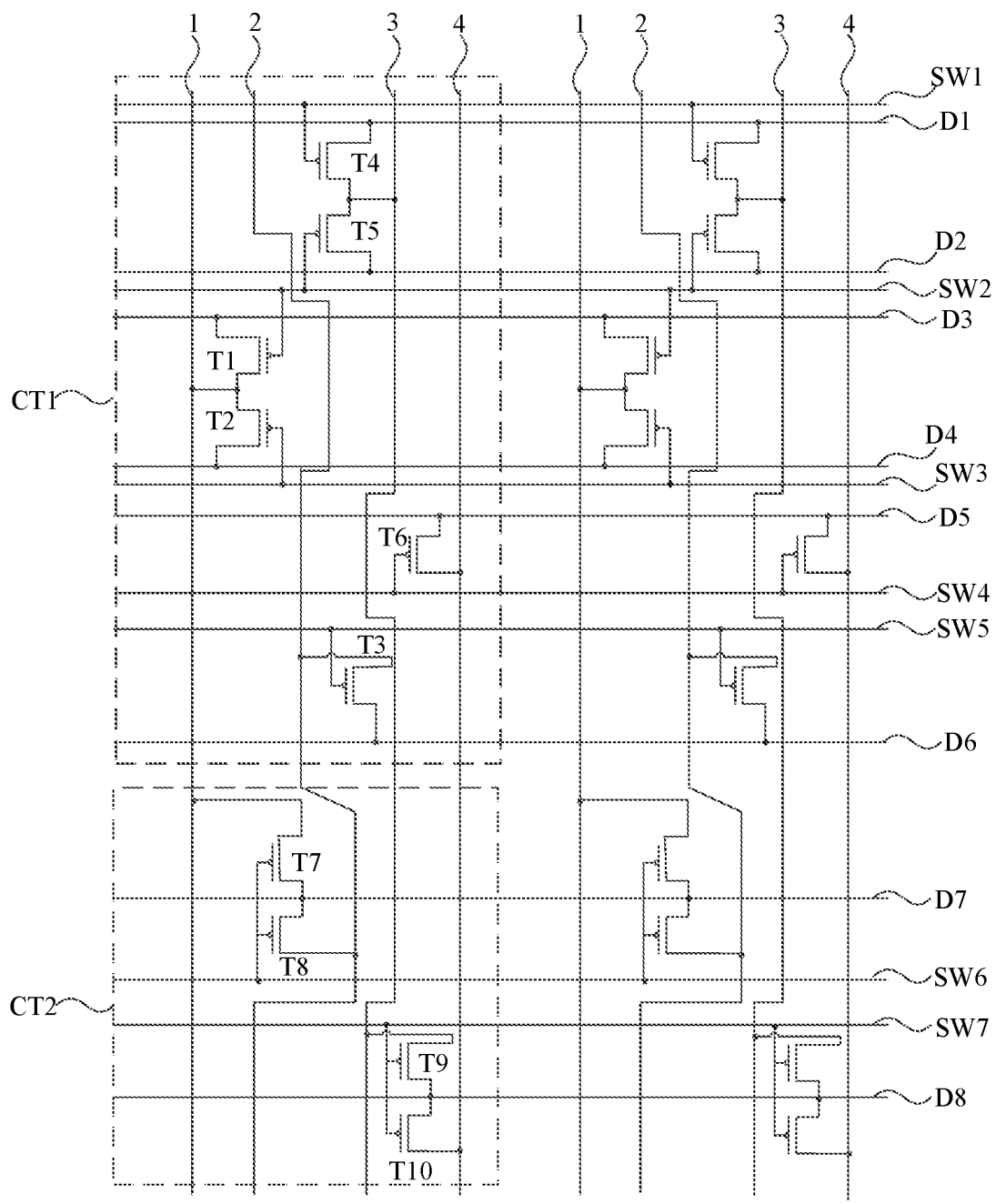
FIG. 1 is a schematic structural diagram of a test circuit provided by embodiments of the disclosure.
Figure 2:
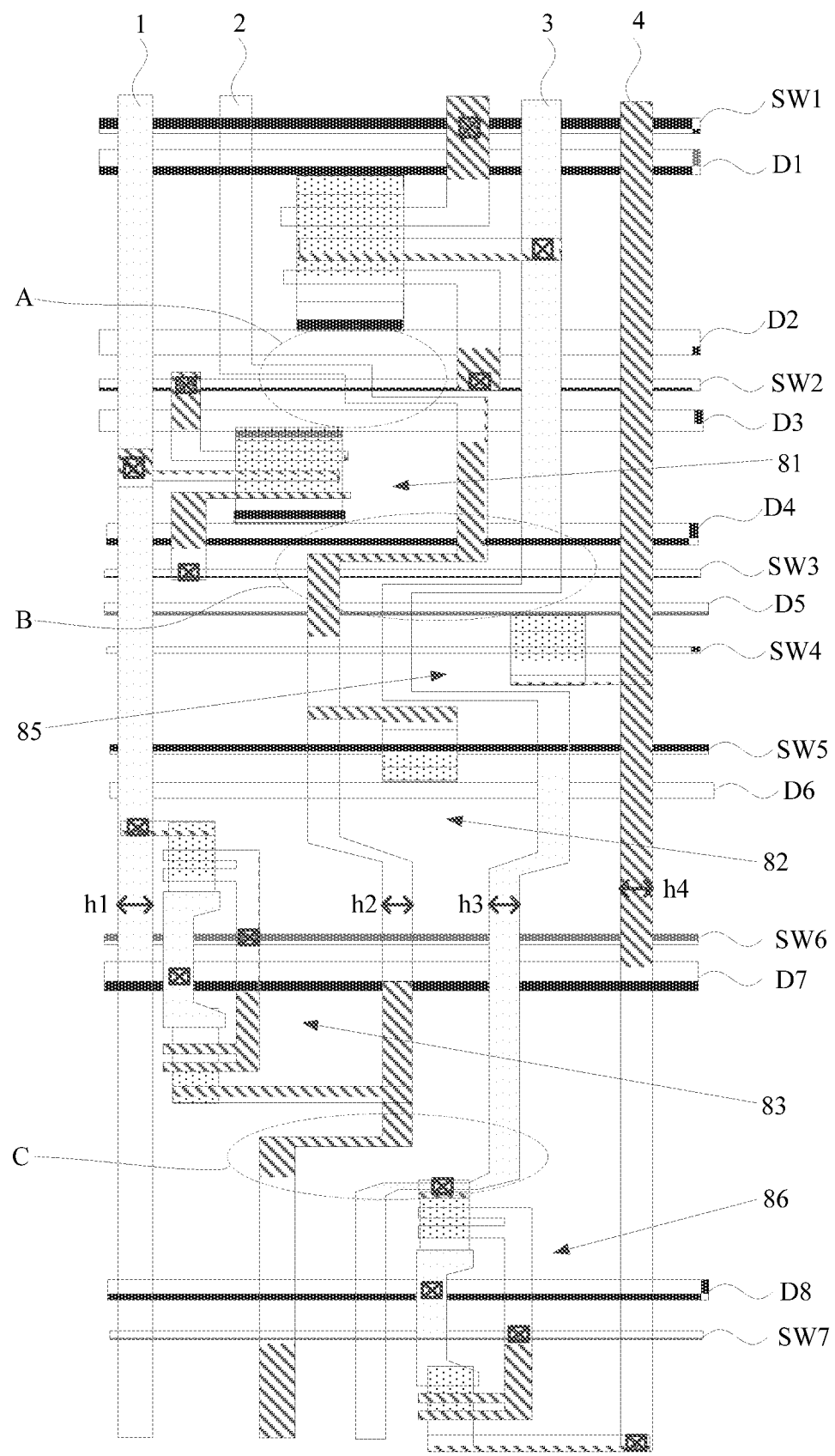
FIG. 2 is a schematic diagram of a layout of a test circuit provided by embodiments of the disclosure.
Figure 6:
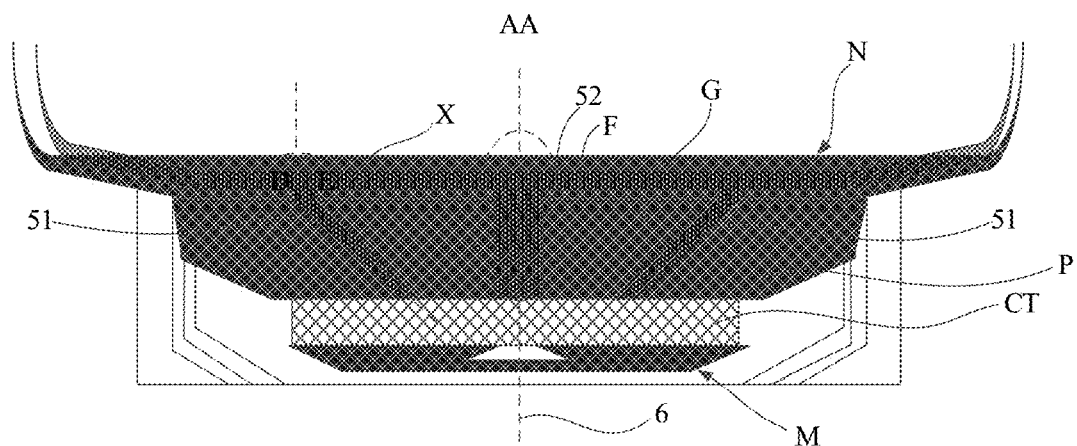
FIG. 6 is a schematic diagram of a layout of a non-display area provided by embodiments of the disclosure.

Please refer to FIGS. 1, 2 and 6, embodiments of the present disclosure provide a display substrate, including: a display area AA and a non-display area located at a periphery of the display area AA, the display substrate also includes a test structure CT in the non-display area, the test structure CT includes multiple test circuits arranged along a first direction, and at least one of the test circuits includes:

multiple test signal lines, where the multiple test signal lines include a first test signal line 1 and a second test signal line 2, the first test signal line 1 extends in a second direction, and the second test signal line 2 includes a first part extending in the first direction and a second part extending in a second direction, and the second direction intersects the first direction.

A width, of the second part of the second test signal line 2, in a direction perpendicular to the second direction is different from a width, of the first test signal line 1, in the direction perpendicular to the second direction. A difference between a resistance of the first test signal line 1 and a resistance of the second test signal line 2 is smaller than a first threshold.

In some embodiments of the present disclosure, a width, of the first part of the second test signal line 2, in a direction perpendicular to the first direction is the same as the width of the first test signal line 1 in the direction perpendicular to the second direction.

Specifically, the display substrate includes the display area AA and the non-display area surrounding the display area AA. For example, the non-display area includes a first fanout area N, a second fanout area P, a test structure CT arrangement area, a third fanout area M and a chip bonding area (not shown in the figure) that are sequentially arranged in a direction of leaving the display area AA, the non-display area further includes a bending area G, and the bending area G is located between the first fanout area N and the second fanout area P. Compared with the related technologies where a test structure CT arrangement area is located between a first fanout area N and a second fanout area P, in some embodiments of the present disclosure, the test structure CT arrangement area is provided between the second fanout area P and the third fanout area M and is farther away from the bending area G, which avoids the adverse effects of crack propagation on the test structure formed when the bending area is bent.

In some embodiments of the present disclosure, each of the test circuits may include multiple test signal lines. For example, the multiple test signal lines may include a first test signal line 1 and a second test signal line 2 with different shapes. The first test signal line 1 extends along the second direction, and the second direction may be the same as the extension direction of the data line in the display substrate, but the present disclosure is not limited to this. The second test signal line 2 may include the first part extending in the first direction and the second part extending in the second direction. The first direction may include multiple directions intersecting the second direction, for example, the first direction is perpendicular to the second direction; or an angle between the first direction and the second direction is less than 90 degrees. In addition, the first direction may be set to be the X direction, and the second direction may be set to be the Y direction.

In some embodiments of the present disclosure, adjustment of the resistance of the first test signal line 1 and the resistance of the second test signal line 2 may be achieved by adjusting the width of the first test signal line 1 in the direction perpendicular to the second direction, the width of the first part of the second test signal line 2 in the direction perpendicular to the first direction and the width of the second part of the second test signal line 2 in the direction perpendicular to the second direction, so that the difference between the resistance of the first test signal line 1 and the resistance of the second test signal line 2 is smaller than the first threshold.

It should be noted that the first threshold may be set according to actual needs. For example, the first threshold is 1Ω. In addition, the difference between the resistance of the first test signal line 1 and the resistance of the second test signal line 2 being less than the first threshold, refers to that the resistance of the first test signal line 1 and the resistance of the second test signal line 2 are essentially equal.

It is also worth noting that, for the width of the first part of the second test signal line 2 in the direction perpendicular to the first direction, the width of the first test signal line 1 in the direction perpendicular to the second direction, the width of the second part of the second test signal line 2 in the direction perpendicular to the second direction, the width of the first test signal line 1 in the direction perpendicular to the second direction, and the "width" mentioned in other parts of the present disclosure, a width may refer to a maximum width, but the present disclosure is not limited to this.

According to the specific structure of the above display substrate, in the display substrate provided by the embodiments of the present disclosure, the width of the second part of the second test signal line 2 in the direction perpendicular to the second direction is different from the width of the first test signal line 1 in the direction perpendicular to the second direction, so that the difference between the resistance of the first test signal line 1 and the resistance of the second test signal line 2 is smaller than the first threshold. In this way, differences among voltage drops of the test signal lines are relatively small; and when same test signals are provided to the display area of the display product through the test circuit, the test signals received by the display area of the display product have a relatively high uniformity, which effectively improves the accuracy of testing the display product.

Figure 3A:
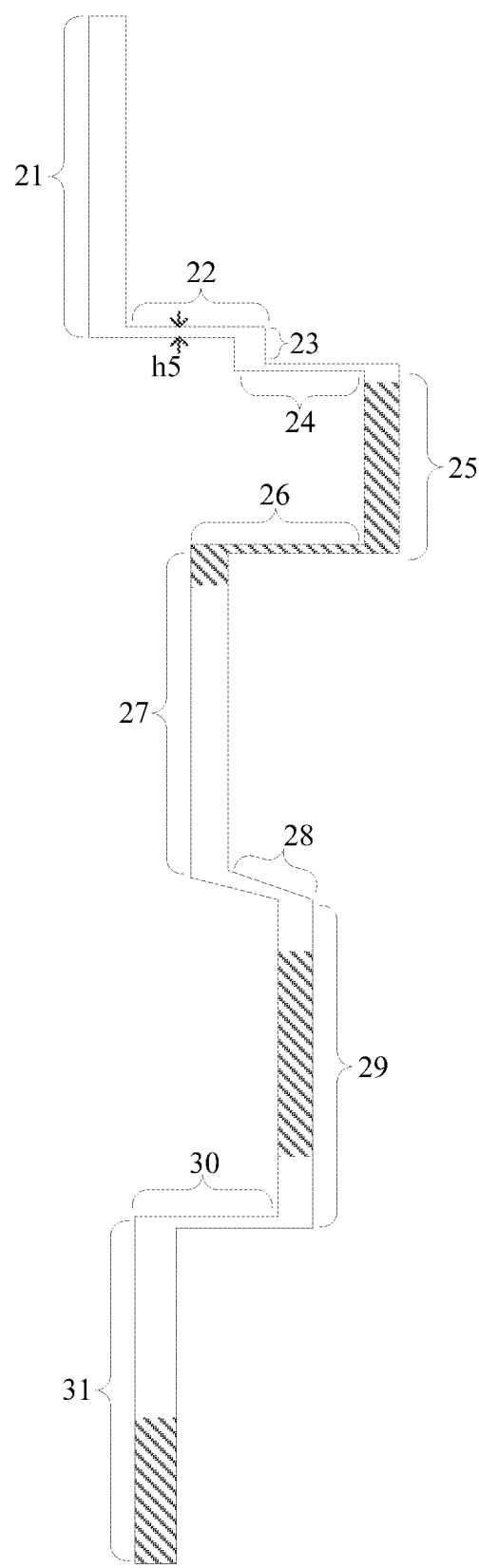
FIG. 3a is a schematic diagram of a second test signal line provided by embodiments of the disclosure.

As shown in FIGS. 2 and 3a, in some embodiments, the width h5 of the first part of the second test signal line 2 in the direction perpendicular to the first direction is smaller than the width h2 of the second part of the second test signal line 2 in direction perpendicular to the second direction; the width h1 of the first test signal line 1 in the direction perpendicular to the second direction is smaller than the width h2 of the second part of the second test signal line 2 in the direction perpendicular to the second direction.

Specifically, a vertical length of the first test signal line 1 in the second direction and a vertical length of the second test signal line 2 in the second direction may be the same. The vertical length of the first test signal line 1 may refer to a length of an orthographic projection, of the first test signal line 1, in the second direction; and the vertical length of the second test signal line 2 may refer to a length of an orthographic projection, of the second test signal line 2, in the second direction. The first test signal line 1 extends in the second direction, i.e., it only including a part extending in the second direction, and the second test signal line 2 includes the first part extending in the first direction and the second part extending in the second direction, therefore, a wiring length of the second test signal line 2 is greater than a wiring length of the first test signal line 1. Hence, when setting the widths of the first test signal line 1 and the second test signal line 2, it may be arranged as follows: a width, of the first part of the second test signal line 2, in the direction perpendicular to the first direction may be smaller than a width, of the second part of the second test signal line 2, in the direction perpendicular to the second direction; a width of the first test signal line 1 in the direction perpendicular to the second direction may be smaller than the width of the second part of the second test signal line 2 in the direction perpendicular to the second direction. In this way, the difference between the resistance of the first test signal line 1 and the resistance of the second test signal line 2 being smaller than the first threshold is achieved, so that differences among voltage drops of the test signal lines are small; and when same test signals are provided to the display area of the display product via the test circuit, the test signals received by the display area of the display product have a relative high uniformity, which effectively improves the accuracy of testing the display product.

As shown in FIG. 1 and FIG. 2, in some embodiments, each of the test circuits further includes: a first test sub-circuit CT1, and the first test sub-circuit CT1 includes:

a first test unit, where an orthographic projection of the first test unit onto a base of the display substrate is between an orthographic projection of the first test signal line 1 onto the base and an orthographic projection of the second test signal line 2 onto the base; an output terminal of the first test unit is coupled to the first test signal line 1, and is configured to output a first image test signal and a second image test signal to the first test signal line 1 in a time division manner;

a second test unit, where an the orthographic projection of the second test unit onto the base is on a side of the orthographic projection of the second test signal line 2 onto the base that is away from the orthographic projection of the first test signal line 1 on the base; an output terminal of the second test unit is coupled to the second test signal line 2, and is configured to output a third image test signal to the second test signal line 2.

Specifically, the operation process of the first test sub-circuit CT1 with the above structure is as follows.

In a first test stage, the first test unit writes the first image test signal to the first test signal line 1, and the second test unit writes the third image test signal to the second test signal line 2, so as to implement the first image test of the display substrate.

In a second test stage, the first test unit writes the second image test signal to the first test signal line 1, and the second test unit writes the third image test signal to the second test signal line 2, so as to implement the second image test of the display substrate.

Exemplarily, the first image test signal includes a blue pixel test signal, the second image test signal includes a red pixel test signal, and the third image test signal includes a green pixel test signal. In the first test period, green-blue (GB) screen test is implemented for the display substrate, and in the second test period, green-red (GR) screen test is implemented for the display substrate.

The first test unit and the second test unit with the above structures can perform display image test of different images on the display substrate in a time-sharing manner, thereby realizing more accurate detection of the display performance of the display substrate.

The specific layout positions of the first test unit and the second test unit are various. In some embodiments, as shown in FIG. 2 and FIG. 3a, the second test signal line 2 includes a conductive pattern 21, a second conductive pattern 22, a third conductive pattern 23, a fourth conductive pattern 24, a fifth conductive pattern 25, a sixth conductive pattern 26 and a seventh conductive pattern 27 that are sequentially coupled;

The first part of the second test signal line 2 includes: the second conductive pattern 22, the fourth conductive pattern 24, and the sixth conductive pattern 26, and the second part of the second test signal line 2 includes: the first conductive pattern 21, the third conductive pattern 23, the fifth conductive pattern 25 and the seventh conductive pattern 27;

a first accommodating space 81 is defined by the second conductive pattern 22, the third conductive pattern 23, the fourth conductive pattern 24, the fifth conductive pattern 25, the sixth conductive pattern 26 and the first test signal line 1 define, and at least part of the first test unit is located in the first accommodating space 81.

Specifically, the second conductive pattern 22, the fourth conductive pattern 24, and the sixth conductive pattern 26 extend along the first direction, the third conductive pattern 23 and the fifth conductive pattern 25 extend along the second direction, and the second conductive pattern 22, the third conductive pattern 23, the fourth conductive pattern 24, the fifth conductive pattern 25 and the sixth conductive pattern 26 are sequentially coupled, hence, the second conductive pattern 22, the third conductive pattern 23, the fourth conductive pattern 24, the fifth conductive pattern 25 and the sixth conductive pattern 26 may form a first groove structure. The opening of the first groove structure is arranged to face the first test signal line 1, so that the first accommodating space 81 may be formed between the first groove structure and the first test signal line 1. When arranging the first test unit, the first test unit may be arranged in the first accommodating space 81 to reduce the overall layout space occupied by the test circuit.

As shown in FIGS. 1 and 2, in some embodiments, each of the test circuits further includes: a second test sub-circuit CT2, and the second test sub-circuit CT2 includes:

a third test unit, where an orthographic projection of the third test unit onto the base of the display substrate is between an orthographic projection of the first test signal line 1 onto the base and an orthographic projection of the second test signal line 2 onto the base; an output terminal of the third test unit is coupled to the first test signal line 1 and the second test signal line 2, and is configured to output same functional test signals to the first test signal line 1 and the second test signal line 2 simultaneously.

Specifically, the operation process of the third test unit with the above structure is as follows.

In a same test stage, the third test unit writes same functional test signals to the first test signal line 1 and the second test signal line 2. A case where high levels of the functional test signals are effective is taken as an example. In a case that the functional test signals are written into the display area of the display substrate, the display area corresponds to a black screen under normal circumstances. If there is an abnormality in the display area (for example, a signal line is disconnected), a low level may occur at the position of the abnormality, which causes the pixel corresponding to the position of the abnormality to be bright. An abnormal bright point appears in the display area. According to the position of the abnormal bright point, the position of the abnormality of the display substrate may be determined.

The above third test unit can detect whether there is any abnormality such as disconnection or poor contact in the display substrate.

As shown in FIG. 2 and FIG. 3a, in some embodiments, the second test signal line 2 further includes: an eighth conductive pattern 28, a ninth conductive pattern 29, a tenth conductive pattern 30 and an eleventh conductive pattern 31 that are sequentially coupled.

The first part of the second test signal line 2 further includes: the eighth conductive pattern 28 and the tenth conductive pattern 30, and the second part of the second test signal line 2 further includes: the ninth conductive pattern 29 and the eleventh conductive pattern 31.

A third accommodating space is defined by the eighth conductive pattern 28, the ninth conductive pattern 29, the tenth conductive pattern 30 and the first test signal line 1, and at least part of the third test unit is located in the third accommodating space.

Specifically, the eighth conductive pattern 28 and the tenth conductive pattern 30 extend along the first direction, the ninth conductive pattern 29 extends along the second direction, and the eighth conductive pattern 28, the ninth conductive pattern 29 and the tenth conductive pattern 30 are sequentially coupled, hence, the eighth conductive pattern 28, the ninth conductive pattern 29 and the tenth conductive pattern 30 may form a third groove structure. The opening of the third groove structure is arranged to face the first test signal line 1, and the third accommodating space 83 may be formed between the third groove structure and the first test signal line 1. When arranging the third test unit, the third test unit may arranged in the third accommodating space 83 to reduce the overall layout space occupied by the test circuit.

As shown in FIGS. 1 and 2, in some embodiments, the multiple test signal lines further include a third test signal line 3 and a fourth test signal line 4, the third test signal line 3 includes a third part extending in the first direction and a fourth part extending in the second direction, and the fourth test signal line 4 extends in the second direction.

A width, of the fourth part of the third test signal line 3, in a direction perpendicular to the second direction is different from a width, of the fourth test signal line 4, in the direction perpendicular to the second direction. Among the first test signal line 1, the second test signal line 2, the third test signal line 3, and the fourth test signal line 4, a difference between resistances of any two test signal lines is smaller than a first threshold.

In some embodiments of the present disclosure, a width, of the third part of the third test signal line 3, in a direction perpendicular to the first direction is the same as the width of the fourth test signal line 4 in the direction perpendicular to the second direction.

Specifically, the multiple test signal lines in each test circuit may include the third test signal line 3 and the fourth test signal line 4 with different shapes, where the fourth test signal line 4 extends along the second direction, and the second direction may be the same as the extension direction of the data line in the display substrate, but the present disclosure is not limited to this. The third test signal line 3 may include the third part extending in the first direction and the fourth part extending in the second direction. The first direction may include multiple directions that intersect the second direction, for example, the first direction is perpendicular to the second direction; or an angle between the first direction and the second direction is less than 90 degrees.

In some embodiments of the present disclosure, adjustment of the resistance of the fourth test signal line 4 and the resistance of the third test signal line 3 may be achieved by adjusting the width of the fourth test signal line 4 in the direction perpendicular to the second direction, the width of the third part of the third test signal line 3 in the direction perpendicular to the first direction and the width of the fourth part of the third test signal line 3 in the direction perpendicular to the second direction, so that the difference between the resistance of the third test signal line 3 and the resistance of the fourth test signal line 4 is smaller than the first threshold. Exemplarily, the first threshold is 1Ω.

In some embodiments of the present disclosure, among the first test signal line 1, the second test signal line 2, the third test signal line 3, and the fourth test signal line 4, the difference between the resistances of any two signal lines is less than the first threshold. That is, the resistance of the first test signal line 1, the resistance of the second test signal line 2, the resistance of the third test signal line 3 and the resistance of the fourth test signal line 4 are essentially equal.

In the display substrate provided by the above embodiments, by setting the width of the second part of the second test signal line 2 in the direction perpendicular to the second direction to be different from the width of the first test signal line 1 in the direction perpendicular to the second direction, and the width of the fourth part of the third test signal line 3 in the direction perpendicular to the second direction to be different from the width of the fourth test signal line 4 in the direction perpendicular to the second direction, the difference between the resistances of any two of the first test signal line 1, the second test signal line 2, the third test signal line 3 and the fourth test signal line 4 is smaller than the first threshold. In this way, differences among voltage drops of the test signal lines are relatively small; and when same test signals are provided to the display area of the display product through the test circuit, the test signals received by the display area of the display product have a relatively high uniformity, which effectively improves the accuracy of testing the display product.

Figure 3B:
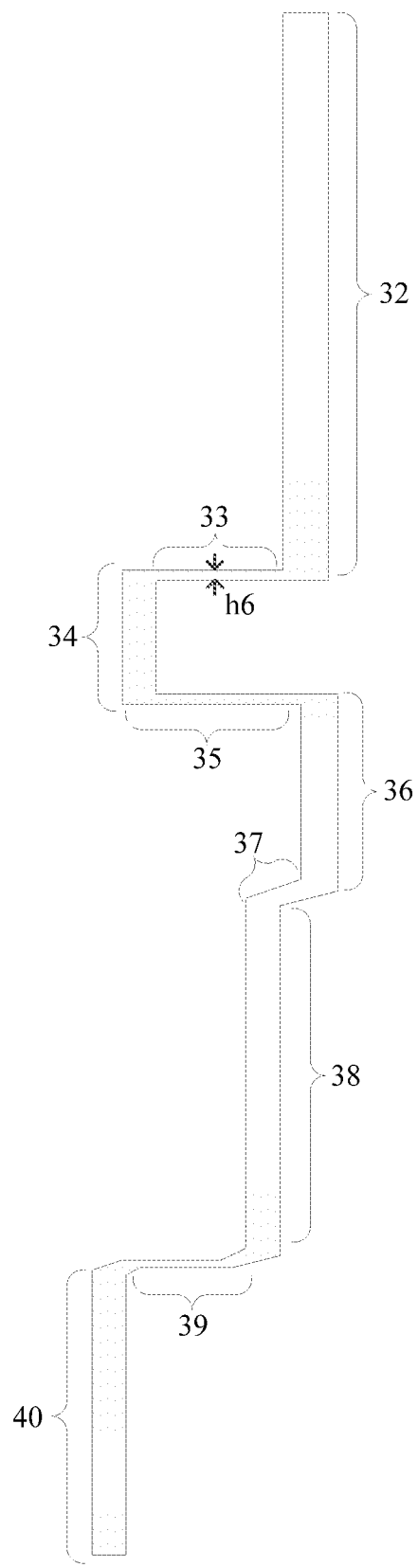
FIG. 3b is a schematic diagram of a third test signal line provided by embodiments of the disclosure.

As shown in FIG. 2 and FIG. 3b, in some embodiments, the width h6 of the third part of the third test signal line 3 in the direction perpendicular to the first direction may be set to be smaller than the width h3 of the fourth part of the third test signal line 3 in the direction perpendicular to the second direction, and the width h4 of the fourth test signal line 4 in the direction perpendicular to the second direction may be set to be smaller than the width h3 of the fourth part of the third test signal line 3 in the direction perpendicular to the second direction.

Specifically, a vertical length of the third test signal line 3 in the second direction and a vertical length of the fourth test signal line 4 in the second direction may be the same. The vertical length of the third test signal line 3 may refer to a length of an orthographic projection, of the third test signal line 3, in the second direction, and the vertical length of the fourth test signal line 4 may refer to a length of an orthographic projection, of the fourth test signal line 4, in the second direction. The fourth test signal line 4 extends in the second direction, i.e., it only including a part extending in the second direction, and the third test signal line 3 includes the third part extending in the first direction and the fourth part extending in the second direction, therefore, a wiring length of the third test signal line 3 is greater than a wiring length of the fourth test signal line 4. Hence, when setting the widths of the third test signal line 3 and the fourth test signal line 4, it may be arranged as follows: a width, of the third part of the third test signal line 3, in the direction perpendicular to the first direction may be smaller than a width, of the fourth part of the test signal line 3, in the direction perpendicular to the second direction; the width of the fourth test signal line 4 in the direction perpendicular to the second direction may be smaller than the width of the fourth part of the third test signal line of 3 in the direction perpendicular to the second direction. In this way, the difference between the resistance of the third test signal line 3 and the resistance of the fourth test signal line 4 being smaller than the first threshold is achieved, so that differences among voltage drops of the test signal lines are small; and when same test signals are provided to the display area of the display product via the test circuit, the test signals received by the display area of the display product have a relative high uniformity, which effectively improves the accuracy of testing the display product.

As shown in FIG. 2, in some embodiments, the width h1 of the first test signal line 1 in the direction perpendicular to the second direction may be set to be the same as the width h4 the fourth test signal line 4 in the direction perpendicular to the second direction; the width h2 of the second part of the second test signal line 2 in the direction perpendicular to the second direction and the width h3 of the fourth part of the third test signal line 3 in the direction perpendicular to the second direction may both be set to be greater than the width h1 of the first test signal line 1 in the direction perpendicular to the second direction.

Specifically, with the above setting method, the resistance of the first test signal line 1 and the resistance of the fourth test signal line 4 are basically the same; a wiring length of the second test signal line 2 and the third test signal line 3 is greater than a wiring lengths of the first test signal line 1 and the fourth test signal line 4, by setting the width of the second part of the second test signal line 2 in the direction perpendicular to the second direction and the width of the fourth part of the third test signal line 3 in the direction perpendicular to the second direction both to be larger than the width of the first test signal line 1 in the direction perpendicular to the second direction, the resistance of the second test signal line 2 and the resistance of the third test signal line 3 are closer to the resistance of the first test signal line 1, which is more conducive to realization of uniformity of resistances of the test signal lines in the test circuit.

It can be seen that when setting the widths of the first test signal line 1, the second test signal line 2, the third test signal line 3, and the fourth signal line in the above manner, only the wiring lengths of the second test signal line 2 and the third test signal line 3, and the wiring length of one of the first test signal line 1 and the fourth test signal line 4 need to be considered, which is more beneficial to realize that the resistance difference between the test signal lines is smaller than the first threshold.

As shown in FIGS. 1 and 2, in some embodiments, each of the test circuits further includes: a first test sub-circuit CT1, and the first test sub-circuit CT1 includes:

a fourth test unit, where an orthographic projection of the fourth test unit onto the base is between an orthographic projection of the second test signal line onto the base and an orthographic projection of third test signal line 3 on the base;

an output terminal of the fourth test unit is coupled to the third test signal line 3, and is configured to output a first image test signal and a second image test signal to the third test signal line 3 in a time division manner;

a fifth test unit, where an orthographic projection of the fifth test unit onto the base is between the orthographic projection of the third test signal line 3 onto the base and an orthographic projection of the fourth test signal line 4 onto the base; an output terminal of the fifth test unit is coupled to the fourth test signal line 4, and is configured to output a third image test signal to the fourth test signal line 4.

In some embodiments, each of the test circuits further includes: a second test sub-circuit CT2, and the second test sub-circuit CT2 includes:

a sixth test unit, where an orthographic projection of the sixth test unit onto the base is between the orthographic projection of the third test signal line 3 onto the base and the orthographic projection of the fourth test signal line 4 onto the base; an output terminal of the sixth test unit is coupled to the third test signal line 3 and the fourth test signal line 4, and is configured to output same functional test signals to the third test signal line 3 and the fourth test signal line 4 simultaneously.

Specifically, the operation process of the first test sub-circuit CT1 with the above structure is as follows.

In the first test stage, the fourth test unit writes the first image test signal to the third test signal line 3, and the fifth test unit writes the third image test signal to the fourth test signal line 4, so as to implement the first image test for the display substrate.

In the second test stage, the fourth test unit writes a second image test signal to the third test signal line 3, and the fifth test unit writes a third image test signal to the fourth test signal line 4, so as to implement the second image test for the display substrate.

Exemplarily, the first image test signal includes a blue pixel test signal, the second image test signal includes a red pixel test signal, and the third image test signal includes a green pixel test signal. In the first test period, GB image test is implemented for the display substrate, and in the second test period, GR image test is implemented for the display substrate.

The fourth test unit and the fifth test unit with the above structures can perform the display image test of different images on the display substrate in a time-sharing manner, so as to realize more accurate detection of the display performance of the display substrate.

The operation process of the sixth test unit with the above structure is as follows.

In a same test stage, the sixth test unit writes same functional test signals to the third test signal line 3 and the fourth test signal line 4. A case where high levels of the functional test signals are effective is taken as an example. In a case that the functional test signals are written into the display area of the display substrate, the display area corresponds to a black screen under normal circumstances. If there is an abnormality in the display area (for example, a signal line is disconnected), a low level may occur at the position of the abnormality, which causes the pixel corresponding to the position of the abnormality to be bright. An abnormal bright point appears in the display area. According to the position of the abnormal bright point, the position of the abnormality of the display substrate may be determined.

The above sixth test unit can detect whether there is any abnormality such as disconnection or poor contact in the display substrate.

As shown in FIGS. 2 and 3b, in some embodiments, the third test signal line 3 includes a twelfth conductive pattern 32, a thirteenth conductive pattern 33, a fourteenth conductive pattern 34, and a fifteenth conductive pattern 35, a sixteenth conductive pattern 36 and seventeenth conductive pattern 37.

The third part of the third test signal line 3 includes the thirteenth conductive pattern 33, the fifteenth conductive pattern 35 and the seventeenth conductive pattern 37, and the fourth part of the third test signal line 3 includes the twelfth conductive pattern 32, the fourteenth conductive pattern 34 and the sixteenth conductive pattern 36;

A second accommodating space 82 is defined by the fifteenth conductive pattern 35, the sixteenth conductive pattern 36, the seventeenth conductive pattern 37 and the second test signal line 2, and at least part of the second test unit is located in the second accommodating space 82.

Specifically, the fifteenth conductive pattern 35 and the seventeenth conductive pattern 37 extend in the first direction, the sixteenth conductive pattern 36 extends in the second direction, and the fifteenth conductive pattern 35, the sixteenth conductive pattern 36, and the seventeenth conductive pattern 37 are sequentially coupled, hence, the fifteenth conductive pattern 35, the sixteenth conductive pattern 36 and the seventeenth conductive patterns 37 may form a second groove structure. The opening of the second groove structure faces the second test signal line 2, and the second accommodating space 82 may be formed between the second groove structure and the second test signal line 2. When arranging the second test unit, the second test unit may be arranged in the second accommodating space 82 to reduce the overall layout space occupied by the test circuit.

As shown in FIGS. 2 and 3b, in some embodiments, a fifth accommodating space 85 is defined by the thirteenth conductive pattern 33, the fourteenth conductive pattern 34, the fifteenth conductive pattern 35 and the fourth test signal line 4, and at least part of the fifth test unit is located in the fifth accommodating space 85.

In the second direction, the fifth accommodating space 85 is located between the first accommodating space 81 and the second accommodating space 82, and the fourth test unit is located one a side of the first accommodating space 81 away from the fifth accommodating space 85.

Specifically, the thirteenth conductive pattern 33 and the fifteenth conductive pattern 35 extend in the first direction, the fourteenth conductive pattern 34 extends in the second direction, and the thirteenth conductive pattern 33, the fourteenth conductive patterns 34 and the fifteenth conductive patterns 35 are sequentially coupled, hence, the thirteenth conductive patterns 33, the fourteenth conductive patterns 34, and the fifteenth conductive pattern 35 may form a fifth groove structure. The opening of the fifth groove structure faces the fourth test signal line 4, and the fifth accommodating space 85 may be formed between the fifth groove structure and the fourth test signal line 4. When arranging the fifth test unit the fifth test unit may be arranged in the fifth accommodating space 85 to reduce the overall layout space occupied by the test circuit.

Moreover, in the above arrangement, along the second direction, the fifth accommodating space 85 is located between the first accommodating space 81 and the second accommodating space 82, and the fourth test unit is located one a side of the first accommodating space 81 away from the fifth accommodating space 85. In this way, along the second direction, the fourth test unit, the first test unit, the fifth test unit, and the second test unit are arranged in sequence, which minimizes the layout space of the first test sub-circuit CT1 in the first direction.

As shown in FIGS. 2 and 3b, in some embodiments, the third test signal line 3 further includes an eighteenth conductive pattern 38, a nineteenth conductive pattern 39, and a twentieth conductive pattern 40 that are sequentially coupled.

The third part of the third test signal line 3 includes the nineteenth conductive pattern 39, and the fourth part of the third test signal line 3 includes the eighteenth conductive pattern 38 and the twentieth conductive pattern 40.

A sixth accommodating space 86 is defined by the nineteenth conductive pattern 39, the twentieth conductive pattern 40 and the fourth test signal line 4, and at least part of the sixth test unit is located in the sixth accommodating space 86.

Specifically, the nineteenth conductive pattern 39 extends in the first direction, the twentieth conductive pattern 40 extends in the second direction, and the nineteenth conductive pattern 39 and the second the ten conductive patterns 40 are sequentially coupled, hence, the sixth accommodating space 86 may be formed between the nineteenth conductive pattern 39, the twentieth conductive pattern 40 and the fourth test signal line 4. When arranging the sixth test unit, the sixth test unit may be arranged in the sixth accommodating space 86 to reduce the overall layout space occupied by the test circuit.

In the display substrate provided by the above embodiments, the test circuit is formed as a double-row structure, and the double-row structure includes: a row formed by the first test signal line 1, the second test signal line 2, the first test unit, the second test unit and the third test unit, and another row formed by the third test signal line 3, the fourth test signal line 4, the fourth test unit, the fifth test unit, and the sixth test unit. The test circuit with this double-row structure can be arranged to be farther away from the bending area of the display substrate. In this way, when the bending area is bent, the influence of the bending on the functional patterns in the test circuit can be reduced, which effectively improves the yield rate of the test circuit.

In order to more clearly illustrate the specific structure and width setting manner of each test signal line in the test circuit in the display substrate provided by the above embodiments, specific examples are provided hereinafter.

As shown in FIG. 2, in the display substrate provided by the above embodiments, the first test signal line 1, the second test signal line 2, the third test signal line 3, and the fourth test signal lines 4 included in the test circuit are arranged in sequence along the first direction; the test circuit includes a first corner area A, a second corner area B, and a third corner area C; the second test signal line 2 in the test circuit includes the first part and the second part in each of the first corner area A, the second corner area B, and the third corner area C; the third test signal line 3 in the test circuit includes the third part and the fourth part in each of the second corner area B and the third corner area C.

When arranging the test signal lines in the test circuit, the first test signal line 1 and the third test signal line 3 may use layout of a first gate metal layer, and the second test signal and the fourth test signal line 4 may use layout of a second gate metal layer, which is more beneficial to reduce the possibility of short circuit between adjacent test signal lines.

When uniformity compensation is performed for the resistance of each test signal line, width compensation may be performed for the second part of the second test signal line 2 in the first corner area A, the second corner area B and the third corner area C, and width compensation is performed for the fourth part of the third test signal line 3 in the second corner area B and the third corner area C.

In more detail, the width of the first test signal line 1 in the direction perpendicular to the second direction may be set between 2.5 μm and 3.5 μm; the width of the fourth test signal line 4 in the direction perpendicular to the second direction may be between 2.5 μm and 3.5 μm; the width of the second part of the second test signal line 2 in the direction perpendicular to the second direction is between 3 μm and 4 μm, and the width of the first part of the second test signal line 2 in the direction perpendicular to the first direction is smaller than the width of the second part of the second test signal line 2 in the direction perpendicular to the second direction; the width of the fourth part of the third test signal line 3 in the direction perpendicular to the second direction is between 3.5 μm and 4.5 μm, and the width of the third part of the third test signal line 3 in the direction perpendicular to the first direction is smaller than the width of the fourth part of the third test signal line 3 in the direction perpendicular to the second direction.

Exemplarily, the width of the first test signal line 1 in the direction perpendicular to the second direction may be set to be 3 μm, and the width of the fourth test signal line 4 in the direction perpendicular to the second direction may be 3 μm. The width of the second part of the second test signal line 2 in the direction perpendicular to the second direction is 3.5 μm, and the width of the fourth part of the third test signal line 3 in the direction perpendicular to the second direction is 4 μm.

The layout of the first test sub-circuit CT1 and the second test sub-circuit CT2 are various. In some embodiments, as shown in FIG. 1, the first test sub-circuit CT1 and the second test sub-circuit CT2 are arranged along the second direction, and the first test sub-circuit CT1 is located between the display area and the second test sub-circuit CT2.

In the related art, the Mux unit connected to the first test sub-circuit CT1 and the module antenna attached in the module process section are too close. Therefore, in the process of testing the display device circuit using the test structure, the signal interference caused between the module antenna and the test sub-circuit CT1 may seriously affect the efficiency and accuracy of testing the display panel.

In the embodiments of the present disclosure, the first test sub-circuit CT1 is disposed between the display area and the second test sub-circuit CT2. By adopting the above solutions in the embodiments of the present disclosure, when forming the display panel with the display substrate, the distance between the MUX and the antenna in the display module can be made farther, thereby effectively reducing the interference of the antenna to the MUX, and making it easier to attach the absorbing material in the module process section. In addition, the signal interference caused by the antenna to the test circuit is effectively reduced, which better improves the test efficiency and test accuracy of the test circuit for the display substrate.

As shown in FIGS. 1 and 2, in some embodiments, the test structure CT further includes: a first control signal line SW1, a second control signal line SW2, a third control signal line SW3, a fourth control signal line SW4, a fifth control signal line SW5a the sixth control signal line SW6, and a seventh control signal line SW7 that all extend in the first direction; and a first test data line D1, a second test data line D2, a third test data line D3, a fourth test data line D4, a fifth test data line D5, a sixth test data line D6, a seventh test data line D7, and an eighth test data line D8 that all extend in the first direction.

The multiple test signal lines further include a third test signal line 3 and a fourth test signal line 4.

Each of the test circuits includes a first test sub-circuit CT1 and a second test sub-circuit CT2; the first test sub-circuit CT1 includes a first test unit, a second test unit, a fourth test unit, and a fifth test unit; the second test sub-circuit CT2 includes a third test unit and a sixth test unit.

The first test unit includes a first transistor T1 and a second transistor T2. The gate of the first transistor T1 is coupled to the second control signal line SW2, the first electrode of the first transistor T1 is coupled to the third test data line D3, and the second electrode of the first transistor T1 is coupled to the first test signal line 1.

The gate of the second transistor T2 is coupled to the third control signal line SW3, the first electrode of the second transistor T2 is coupled to the fourth test data line D4, and the second electrode of the second transistor T2 is coupled to the first test signal line 1.

The second test unit includes a third transistor T3, the gate of the third transistor T3 is coupled to the fifth control signal line SW5, the first electrode of the third transistor T3 is coupled to the sixth test data line D6, and the second electrode of the third transistor T3 is coupled to the second test signal line 2.

The fourth test unit includes a fourth transistor T4 and a fifth transistor T5. The gate of the fourth transistor T4 is coupled to the first control signal line SW1, the first electrode of the fourth transistor T4 is coupled to the first test data line D1, and the second electrode of the fourth transistor T4 is coupled to the third test signal line 3.

The gate of the fifth transistor T5 is coupled to the second control signal line SW2, the first electrode of the fifth transistor T5 is coupled to the second test data line D2, and the second electrode of the fifth transistor T5 is coupled to the third test signal line 3.

The fifth test unit includes a sixth transistor T6. The gate of the sixth transistor T6 is coupled to the fourth control signal line SW4, the first electrode of the sixth transistor T6 is coupled to the fifth test data line D5, and the second electrode of the sixth transistor T6 is coupled to the fourth test signal line 4.

The third test unit includes a seventh transistor T7 and an eighth transistor T8. The gate of the seventh transistor T7 and the gate of the eighth transistor T8 are both coupled to the sixth control signal line SW6, the first electrode of the seventh transistor T7 and the first electrode of the eighth transistor T8 are both coupled to the seventh test data line D7, the second electrode of the seventh transistor T7 is coupled to the first test signal line 1, and the second electrode of the eighth transistor T8 is coupled to the second test signal line 2.

The sixth test unit includes a ninth transistor T9 and a tenth transistor T10, the gate of the ninth transistor T9 and the gate of the tenth transistor T10 are both coupled to the seventh control signal line SW7, the first electrode of the ninth transistor T9 and the first electrode of the tenth transistor T10 are both coupled to the eighth test data line D8, the second electrode of the ninth transistor T9 is coupled to the third test signal line 3, and the second electrode of the tenth transistor T10 is coupled to the fourth test signal line 4.

Specifically, the first test data line D1 and the third test data line D3 are both used to transmit the first image test signal; the second test data line D2 and the fourth test data line D4 are both used to transmit the second image test signal; the fifth test data line D5 and the sixth test data line D6 are both used for the third image test signal; the seventh test data line D7 and the eighth test data line D8 are both used to transmit the functional test signal.

When the test circuit with the above structure is operating, the operation working process is as follows.

In a first test stage, under the control of a second control signal transmitted by the second control signal line SW2, the first transistor T1 is turned on, to write the first image test signal transmitted by the third test data line D3 into the first test signal line 1; under the control of a first control signal transmitted by the first control signal line SW1, the fourth transistor T4 is turned on, to write the first image test signal D1 transmitted by the first test data line into the third test signal line 3; under the control of a fifth control signal transmitted by the fifth control signal line SW5, the third transistor T3 is turned on, to write the third image test signal transmitted by the sixth test data line D6 into the second test signal line 2.

In a second test stage, under the control of a third control signal transmitted by the third control signal line SW3, the second transistor T2 is turned on, to write the second image test signal transmitted by the fourth test data line D4 into the first test signal line 1; under the control of a second control signal transmitted by the second control signal line SW2, the fifth transistor T5 is turned on, to write the second image test signal transmitted by the second test data line D2 into the third test signal line 3; under the control of a fourth control signal transmitted by the fourth control signal line SW4, the sixth transistor T6 is turned on, to write the third image test signal transmitted by the fifth test data line D5 into the fourth test signal line 4.

In a third test stage, under the control of a sixth control signal transmitted by the sixth control signal line SW6, the seventh transistor T7 and the eighth transistor T8 are turned on, to write the functional test signal transmitted by the seventh test data line D7 into the first test signal line 1 and the second test signal line 2; under the control of a seventh control signal transmitted by the seventh control signal line SW7, the ninth transistor T9 and the tenth transistors are T10 turned on, to write the functional test signal transmitted by the eighth test data line D8 into the third test signal line 3 and the fourth test signal line 4.

It should be noted that the sequence of the first test stage, the second test stage, and the third test stage may be set according to actual needs.

It is worth noting that, as shown in FIG. 2, when the test circuit adopts the above structure, the test circuit may adopt the following four film layers to realize the layout: an active layer, a first gate metal layer, a second gate metal layer, and a source-drain metal layer that are stacked in sequence, in the direction of leaving the base of the display substrate; the active layer is used to form an active layer of each of the transistors, and the first gate metal layer is used to form the second test signal line 2, the fourth test signal line 4, the gate of each transistor and the first and second electrodes of some transistors; the second gate metal layer is used to form the first test signal line 1, the third test signal line 3, and the first and second electrodes of some transistors; the source-drain metal layers is used to form the first and second electrodes of some transistors, and each control signal line.

Figure 7:
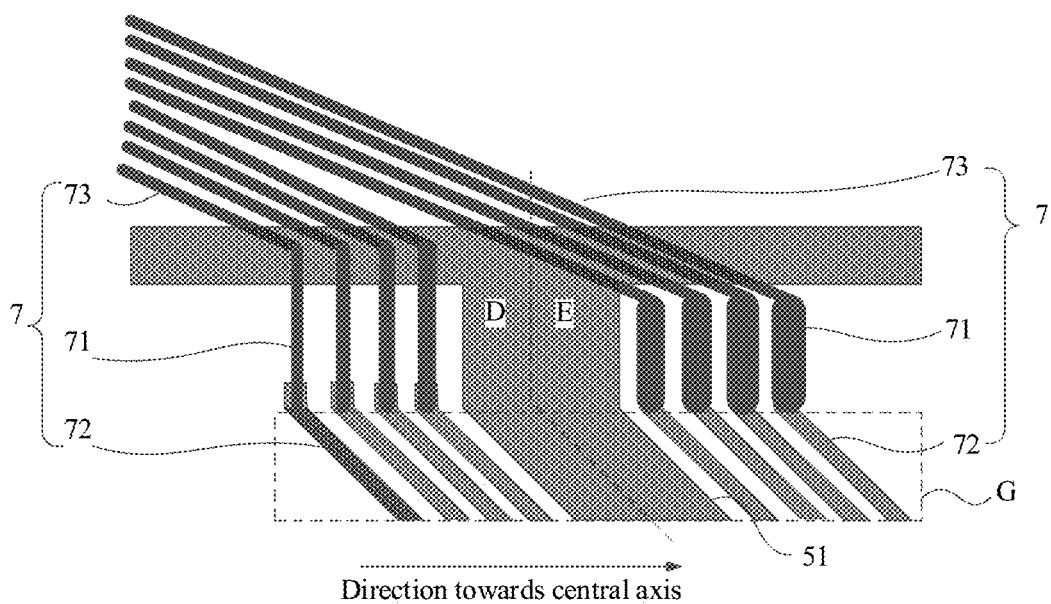
FIG. 7 is an enlarged schematic diagram of part X in FIG. 6.

As shown in FIGS. 6 and 7, in some embodiments, the display substrate further includes:

multiple data signal lines in the display area, where the data signal lines respectively correspond to the test signal lines;

multiple fanout lines 7 in the non-display area, where the fanout lines 7 respectively correspond to the data signal lines, and the data signal line is coupled to the corresponding test signal line through the corresponding fanout line 7; the multiple fanout lines 7 form multiple sub-fanout areas arranged along the first direction, and each of the multiple sub-fanout areas includes fanout lines 7;

multiple power signal line patterns, where an orthographic projection of each power signal line pattern onto the base is between orthographic projections of two adjacent sub-fanout areas onto the base; resistances of the fanout lines 7 on a same side of a central axis 6 of the display substrate gradually increase along a direction towards the central axis 6, a difference between resistances of any two adjacent fanout lines is smaller than a second threshold, and the central axis extends in a direction parallel to the second direction.

Specifically, the display substrate further includes multiple data signal lines located in the display area. Exemplarily, the multiple data signal lines extend along the second direction, and the data signal lines respectively correspond to the test signal lines.

The display substrate further includes the multiple fanout lines 7 located in the non-display area, and the orthographic projections of the multiple fanout lines 7 onto the base are between the orthographic projection of the display area onto the base and the orthographic projection of the test circuit on the base. The fanout lines 7 respectively correspond to the data signal lines. A terminal of the fanout line 7 close to the display area is coupled to the corresponding data line. A terminal of the fanout line 7 close to the test circuit is coupled to the corresponding test signal line. The fanout line 7 is used to transmit the test signal provided by the corresponding test signal line to the corresponding data line.

The multiple fanout lines 7 may be divided into multiple sub-fanout areas arranged along the first direction, and each of the sub-fanout areas includes fanout lines 7.

The display substrate further includes the multiple power signal line patterns 51, and the orthographic projection of each of the power signal line patterns 51 onto the base is between the orthographic projections of two adjacent sub-fanout areas onto the base, to separate the two adjacent sub-fanout areas (such as the D area and the E area). The fanout line 7 cannot be arranged at the power signal line pattern 51, hence the multiple fanout lines 7 cannot be arranged evenly at equal intervals, which may lead to the problem of large resistance jump of the fanout lines 7 on two sides of the power signal line pattern 51.

In the display substrate provided by the above embodiments, resistances of the fanout lines 7 on a same side of a central axis 6 of the display substrate gradually increase along a direction towards the central axis 6, and a difference between resistances of any two adjacent fanout lines is smaller than a second threshold. In this way, the resistances of the fanout lines 7 are uniformly changed, which avoids the problem of large resistance jump of the fanout lines 7 on two sides of the power signal line pattern. It should be noted that the second threshold may be set according to actual needs. For example, the second threshold is between 0.5Ω-10Ω, inclusively.

It should be noted that the difference between the resistances of any two adjacent fanout lines being smaller than the second threshold refers to that the resistances of any two adjacent fanout lines are essentially equal.

As shown in FIGS. 6 and 7, in some embodiments, at least one of the fanout lines 7 includes: a first fanout pattern 71 and a second fanout pattern 72 that are coupled, the first fanout pattern 71 is between the display area and the second fanout pattern 72, the first fanout pattern 71 extends in the second direction, the second fanout pattern 72 extends in a third direction, and the third direction intersects the second direction.

On a same side of the central axis 6 and along the direction towards the central axis 6 of the display substrate, widths of the first fanout patterns 71 of the fanout lines 7 in a same sub-fanout area gradually increase, and widths of the second fanout patterns 72 of the fanout lines 7 in the same sub-fanout area are the same.

On a same side of the central axis 6, for two adjacent sub-fanout areas, a width of the first fanout pattern 71 that is farthest from the central axis 6 in the sub-fanout area E closer to the central axis 6, is greater than, a width of the first fanout pattern 71 that is closest to the central axis 6 in the sub-fanout area D farther away from the central axis 6; a difference, between the width of the first fanout pattern 71 that is farthest from the central axis 6 in the sub-fanout area E closer to the central axis and the width of the first fanout pattern 71 that is closest to the central axis 6 in the sub-fanout area D farther away from the central axis, is greater than a third threshold.

The width of the first fanout pattern 71 is a width of the first fanout pattern 71 in the direction perpendicular to the second direction, and the width of the second fanout pattern 72 is a width of the second fanout pattern 72 in the direction perpendicular to the third direction.

Specifically, each fanout line 7 includes: the third fanout pattern 73, the first fanout pattern 71, and the second fanout pattern 72 that are sequentially coupled, and the third fanout pattern 73 and the first fanout pattern 71 are made of the same layer and in the same layer. Specifically, the first gate metal layer and/or the second gate metal layer may be used for manufacture. The second fanout pattern 72 and the power signal line pattern 51 are made in the same layer using the source-drain metal layer. In addition, the first fanout pattern 71 may be set to be located between the display area and the second fanout pattern 72, the first fanout pattern 71 extends along the second direction, the second fanout pattern 72 extends along the third direction, and the third direction intersects the second direction. Illustratively, the angle between the third direction and the second direction is less than 90 degrees.

Further, it may be set that: the extension direction of the power signal line pattern is the same as the extension direction of the second fanout pattern 72, and the orthographic projection of the power signal line pattern onto the base is between the orthographic projections of the second fanout patterns 72 of two adjacent sub-fanout areas onto the base.

Since the second fanout pattern 72 and the power signal line pattern 51 are made in the same layer using the source-drain metal layer, the power signal line pattern 51 may block adjacent sub-fanout areas, so that the fanout lines 7 cannot be evenly arranged at equal intervals, and the wiring lengths of the fanout lines 7 cannot be uniformly increased, resulting in a large jump in the resistances of the fanout lines 7 on the left and right sides of the power signal line pattern 51.

In the above, it is arranged as follows: on a same side of the central axis 6 and along the direction towards the central axis 6 of the display substrate, widths of the first fanout patterns 71 of the fanout lines 7 in a same sub-fanout area gradually increase, and widths of the second fanout patterns 72 of the fanout lines 7 in the same sub-fanout area are the same; on a same side of the central axis 6, for two adjacent sub-fanout areas, a width of the first fanout pattern 71 that is farthest from the central axis 6 in the sub-fanout area E closer to the central axis 6, is greater than, a width of the first fanout pattern 71 that is closest to the central axis 6 in the sub-fanout area D farther away from the central axis 6; a difference, between the width of the first fanout pattern 71 that is farthest from the central axis 6 in the sub-fanout area E closer to the central axis and the width of the first fanout pattern 71 that is closest to the central axis 6 in the sub-fanout area D farther away from the central axis, is greater than the third threshold. In this way, on a same side of the central axis 6, the resistances of all the fanout lines 7 in the display substrate gradually increase along the direction towards the central axis 6 of the display substrate, so that the resistances of the fanout lines 7 change uniformly, which avoids the problem of large resistance jump of the fanout lines 7 on two sides of the power signal line pattern.

Therefore, in the display substrate provided by the above embodiments, compensation for resistances of the fanout lines 7 are achieved by adjusting the widths of the first fanout patterns 71, so that the resistances of the test signal lines in the test circuit and the fanout lines 7 connected between the data lines and the test signal lines all have good resistance uniformity, which greatly improves the accuracy of the test circuit for the display substrate test, and better guarantees the production yield of the display substrate.

It should be noted that the value range of the above third threshold can enable that: that the difference between resistances of any two adjacent fanout lines is smaller than the second threshold.

Figure 8:
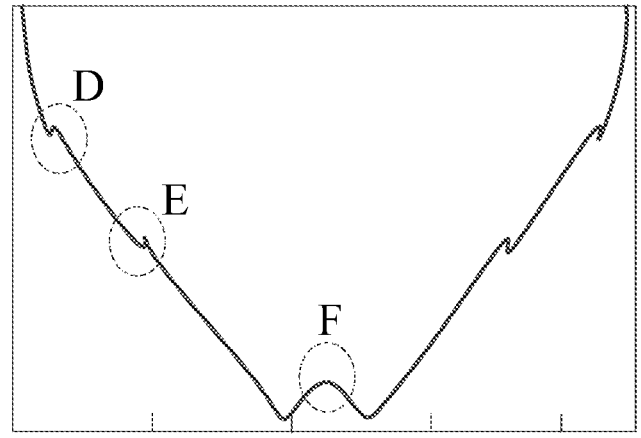
FIG. 8 is a schematic diagram of resistance changes of fanout lines in D area, E area and F area before compensation.
Figure 9:
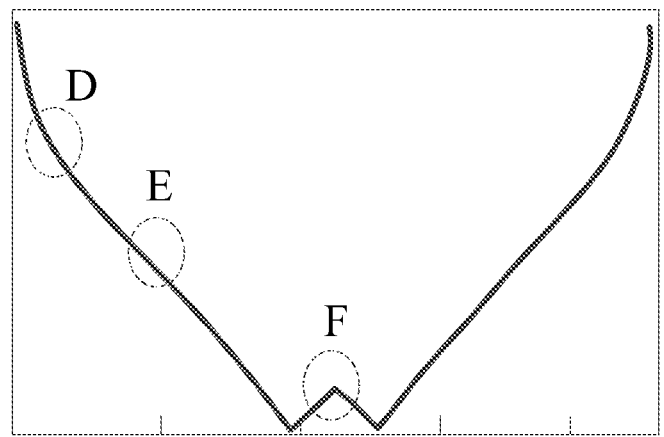
FIG. 9 is a schematic diagram of resistance change of fanout lines in D area, E area and F area after compensation.

In more detail, as shown in FIGS. 8 and 9 and Table 1, before compensation, due to the blocking of the power signal line pattern, there is a relatively large jump from the average value of the resistances of the fanout lines 7 in the D area to the average value of the resistances of the fanout lines 7 in the E area. For example, the average value of the resistances in the D area is 3502Ω, the average value of the resistances in the E area is 3549Ω, and the jump from the average resistance of the fanout lines 7 in the D area to that in the E area is close to 50Ω. The change amount in resistance is 1.34%;

Through calculation simulation, there is a small jump from the average value of the resistances of the fanout lines 7 in the D area to the average value of the resistances of the fanout lines 7 in the E area after the width uniformity compensation. For example, the average value of the resistances in the D area is 3340Ω, the average value of the resistances in the E area is 3348Ω; the change in the resistance curve after the uniform compensation is relatively smooth, and the change amount is about 0.24% (the core point of the change amount).

TABLE 1

|  | D | E | Δ | Δ/D |
|---|---|---|---|---|
| Before compensation (Ω) | 3502 | 3549 | 47 | 1.34% |
| After compensation (Ω) | 3340 | 3348 | 8 | 0.24% |

It should be noted that the display substrate may further include an intermediate power signal line pattern 52 located at the central axis 6. The fanout lines 7 are symmetrically distributed on both sides of the central axis 6, so that wiring lengths of the fanout lines 7 in the adjacent fanout sub-areas (i.e., F areas) on the left and right sides of intermediate power signal line pattern 52 are the same and the widths of the second fanout patterns 72 included therein are the same. As a result, average resistances of the fanout lines 7 in the adjacent fanout sub-areas on the left and right sides of intermediate power signal line pattern 52 are basically the same, and a large jumps may not occur.

In the above, the widths of the test signal lines and the widths of the fanout lines are compensated to realize the uniformity compensation of the sum of the resistances of the test signal lines and the fanout lines. When the test signal lines and the fanout lines are set to adopt the above widths, the beneficial effects produced are as follows.

Figure 4:
FIG. 4 is a schematic diagram of resistance change trend of four test signal lines in a test circuit before compensation.
Figure 5:
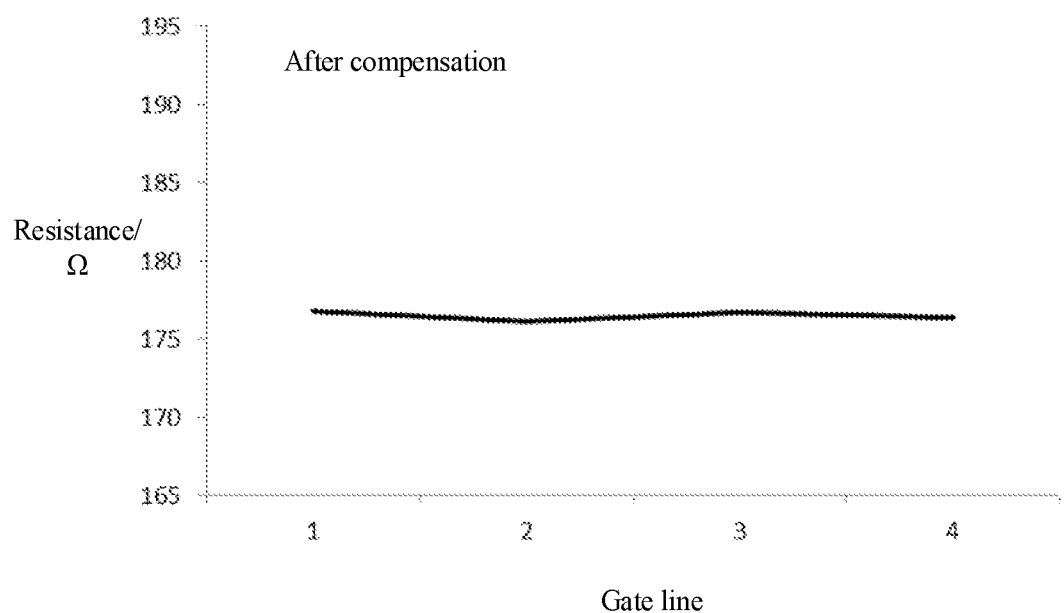
FIG. 5 is a schematic diagram of resistance change trend of four test signal lines in a test circuit after compensation.

As shown in FIGS. 4 and 5 and Table 2, through resistance simulation calculation, before the resistance uniformity compensation, the sum of the resistances of the first test signal line 1 and the corresponding fanout line is 176.78. The sum of the resistances of the second test signal line 2 and the corresponding fanout line is 188.75, the sum of the resistances of the third test signal line 3 and the corresponding fanout line is 190.36, and the sum of the resistances of the fourth test signal line 4 and the corresponding fanout line is 176.36. It can be seen that the difference between the maximum value and the minimum value is 14Ω.

After the resistance uniformity compensation, the sum of the resistances of the first test signal line 1 and the corresponding fanout line is 176.78, the sum of the resistances of the second test signal line 2 and the corresponding fanout line is 176.09, the sum of the resistances of the third test signal line 3 and the corresponding fanout line is 176.68, and the sum of the resistances of the fourth test signal line 4 and the corresponding fanout line is 176.36. It can be seen that the difference between the maximum value and the minimum value is 0.69Ω.

TABLE 2

| line | 1 | 2 | 3 | 4 | Δ(Max − Min) |
|---|---|---|---|---|---|
| Before compensation (Ω) | 176.78 | 188.75 | 190.36 | 176.36 | 14 |
| After compensation (Ω) | 176.78 | 176.09 | 176.68 | 176.36 | 0.69 |

It can be seen from the change effect of the resistances before and after compensation that there are sudden changes in the resistances of the four test signal lines and the fanout lines before compensation, the resistance change range is about 170Ω~190Ω, and the maximum resistance difference is about 14Ω. The resistance relationship curve after compensation is relatively smooth and the resistance fluctuation range is small, which is basically maintained at about 176Ω (176Ω is the core resistance, and the sum of the resistances of each test signal line and each fanout line needs to be close to 176Ω).

The embodiments of the present disclosure also provide a display device, which includes the display substrate provided in the above embodiments.

In the display substrate provided by the embodiments of the present disclosure, the width of the second part of the second test signal line 2 in the direction perpendicular to the second direction is different from the width of the first test signal line 1 in the direction perpendicular to the second direction, so that the difference between the resistance of the first test signal line 1 and the resistance of the second test signal line 2 is smaller than the first threshold. In this way, differences among voltage drops of the test signal lines are relatively small; and when same test signals are provided to the display area of the display product through the test circuit, the test signals received by the display area of the display product have a relatively high uniformity, which effectively improves the accuracy of testing the display product.

Therefore, when the display device provided by the embodiments of the present disclosure includes the display substrate provided by the above embodiments, it also has the above beneficial effects, which are not further described herein.

It should be noted that the display device may be any product or component with a display function, such as a TV, a monitor, a digital photo frame, a mobile phone, a tablet computer, and so on.

The embodiments of the present disclosure also provide a manufacturing method of a display substrate, which is used to manufacture the display substrate provided in the above embodiments, and the manufacturing method includes:

manufacturing a test structure CT in a non-display area of the display substrate, where the test structure CT includes multiple test circuits arranged along a first direction, and each of at least one test circuit of the multiple test circuits includes: multiple test signal lines, the multiple test signal lines include a first test signal line 1 and a second test signal line 2, the first test signal line 1 extends in a second direction, the second test signal line 2 includes a first part extending in the first direction and a second part extending in the second direction, and the second direction intersects the first direction; a width, of the second part of the second test signal line 2, in a direction perpendicular to the second direction is different from a width, of the first test signal line 1, in the direction perpendicular to the second direction, and a difference between a resistance of the first test signal line 1 and a resistance of the second test signal line 2 is smaller than a first threshold.

In some embodiments of the present disclosure, a width, of the first part of the second test signal line 2, in a direction perpendicular to the first direction is the same as the width of the first test signal line 1 in the direction perpendicular to the second direction.

Specifically, the display substrate includes the display area AA and the non-display area surrounding the display area AA. For example, the non-display area includes a first fanout area N, a second fanout area P, a test structure CT arrangement area, a third fanout area M and a chip bonding area (not shown in the figure) that are sequentially arranged in a direction of leaving the display area AA, the non-display area further includes a bending area G, and the bending area G is located between the first fanout area N and the second fanout area P. Compared with the related technologies where a test structure CT arrangement area is located between a first fanout area N and a second fanout area P, in some embodiments of the present disclosure, the test structure CT arrangement area is provided between the second fanout area P and the third fanout area M and is farther away from the bending area G, which avoids the adverse effects of crack propagation on the test structure formed when the bending area is bent.

In some embodiments of the present disclosure, each of the test circuits may include multiple test signal lines. For example, the multiple test signal lines may include a first test signal line 1 and a second test signal line 2 with different shapes. The first test signal line 1 extends along the second direction, and the second direction may be the same as the extension direction of the data line in the display substrate, but the present disclosure is not limited to this. The second test signal line 2 may include the first part extending in the first direction and the second part extending in the second direction. The first direction may include multiple directions intersecting the second direction, for example, the first direction is perpendicular to the second direction; or an angle between the first direction and the second direction is less than 90 degrees. In addition, the first direction may be set to be the X direction, and the second direction may be set to be the Y direction.

In some embodiments of the present disclosure, adjustment of the resistance of the first test signal line 1 and the resistance of the second test signal line 2 may be achieved by adjusting the width of the first test signal line 1 in the direction perpendicular to the second direction, the width of the first part of the second test signal line 2 in the direction perpendicular to the first direction and the width of the second part of the second test signal line 2 in the direction perpendicular to the second direction, so that the difference between the resistance of the first test signal line 1 and the resistance of the second test signal line 2 is smaller than the first threshold.

It should be noted that the first threshold may be set according to actual needs. For example, the first threshold is 1Ω. In addition, the difference between the resistance of the first test signal line 1 and the resistance of the second test signal line 2 being less than the first threshold, refers to that the resistance of the first test signal line 1 and the resistance of the second test signal line 2 are essentially equal.

In the display substrate manufactured by the manufacturing method provided by the embodiments of the present disclosure, the width of the second part of the second test signal line 2 in the direction perpendicular to the second direction is different from the width of the first test signal line 1 in the direction perpendicular to the second direction, so that the difference between the resistance of the first test signal line 1 and the resistance of the second test signal line 2 is smaller than the first threshold. In this way, differences among voltage drops of the test signal lines are relatively small; and when same test signals are provided to the display area of the display product through the test circuit, the test signals received by the display area of the display product have a relatively high uniformity, which effectively improves the accuracy of testing the display product.

It should be noted that the various embodiments in this specification are described in a progressive manner, reference can be made to each other for the same or similar parts between the various embodiments, and each embodiment focuses on the differences from other embodiments. In particular, for the method embodiments, since they are basically similar to the product embodiments, the descriptions thereof are relatively simple, and reference can be made to the descriptions of the product embodiments for the relevant parts.

Unless otherwise defined, the technical or scientific terms used in the present disclosure shall have the common meanings understood by those of ordinary skill in the art to which the present disclosure belongs. The terms "first", "second", and the like used in the present disclosure do not indicate any order, quantity, or importance, but are only used to distinguish different components. Word such as "including" or "having" means that the element or item listed before the word covers the element or item listed after the word and the equivalent thereof without excluding other elements or items. Word such as "connecting", "coupled" or "connected" are not limited to physical or mechanical connection, but may include electrical connection, whether direct or indirect. "Up", "down", "left", "right", etc., are only used to indicate the relative position relationship. When the absolute position of the described object changes, the relative position relationship may change accordingly.

It can be understood that when an element such as a layer, film, region, or substrate is referred to as being "on" or "under" another element, the element may be "directly" on or "under" the another element, or there may be an intermediate element.

In the descriptions of the above embodiments, specific features, structures, materials, or characteristics may be combined in any one or more embodiments or examples in a suitable manner.

The above descriptions are merely some implementations of the present disclosure, and the protection scope of the present disclosure is not limited thereto. For those of ordinary skill in the art, within the technical scope disclosed in the present disclosure, changes or substitutions can be made. These changes or substitutions shall fall with the protection scope of the present disclosure. Therefore, the protection scope of the present disclosure is determined by the claims.

What is claimed is:

1. A display substrate, comprising: a display area and a non-display area at a periphery of the display area, wherein the display substrate further comprises a test structure in the non-display area, the test structure comprises a plurality of test circuits arranged along a first direction, and each of at least one test circuit of the plurality of test circuits comprises:
    a plurality of test signal lines, wherein the plurality of test signal lines comprises a first test signal line and a second test signal line, the first test signal line extends in a second direction, the second test signal line comprises a first part extending in the first direction and a second part extending in the second direction, and the second direction intersects the first direction;
    wherein a width, of the second part of the second test signal line, in a direction perpendicular to the second direction is different from a width, of the first test signal line, in the direction perpendicular to the second direction, and a difference between a resistance of the first test signal line and a resistance of the second test signal line is smaller than a first threshold.

2. The display substrate according to claim 1, wherein a width, of the first part of the second test signal line, in a direction perpendicular to the first direction is the same as the width of the first test signal line in the direction perpendicular to the second direction.

3. The display substrate according to claim 2, wherein the width of the first part of the second test signal line in the direction perpendicular to the first direction is smaller than the width of the second part of the second test signal line in the direction perpendicular to the second direction; the width of the first test signal line in the direction perpendicular to the second direction is smaller than the width of the second part of the second test signal line in the direction perpendicular to the second direction.

4. The display substrate according to claim 3, wherein a wiring length of the second test signal line is greater than a wiring length of the first test signal line.

5. The display substrate according to claim 1, wherein the test circuit further comprises a first test sub-circuit, and the first test sub-circuit comprises:
    a first test unit, wherein an orthographic projection of the first test unit onto a base of the display substrate is between an orthographic projection of the first test signal line onto the base and an orthographic projection of the second test signal line onto the base; an output terminal of the first test unit is coupled to the first test signal line, and is configured to output a first image test signal and a second image test signal to the first test signal line in a time division manner;
    a second test unit, wherein an orthographic projection of the second test unit onto the base is on a side of the orthographic projection of the second test signal line onto the base that is away from the orthographic projection of the first test signal line onto the base; an output terminal of the second test unit is coupled to the second test signal line, and is configured to output a third image test signal to the second test signal line.

6. The display substrate according to claim 5, wherein the second test signal line comprises a first conductive pattern, a second conductive pattern, a third conductive pattern, a fourth conductive pattern, and a fifth conductive pattern, a sixth conductive pattern and a seventh conductive pattern that are sequentially coupled;
    the first part of the second test signal line comprises the second conductive pattern, the fourth conductive pattern and the sixth conductive pattern, and the second part of the second test signal line comprises the first conductive pattern, the third conductive pattern, the fifth conductive pattern and the seventh conductive pattern;
    a first accommodating space is defined by the second conductive pattern, the third conductive pattern, the fourth conductive pattern, the fifth conductive pattern, the sixth conductive pattern and the first test signal line define, and at least part of the first test unit is in the first accommodating space.

7. The display substrate according to claim 1, wherein the test circuit further comprises a second test sub-circuit, and the second test sub-circuit comprises:
    a third test unit, wherein an orthographic projection of the third test unit onto a base of the display substrate is between an orthographic projection of the first test signal line onto the base and an orthographic projection of the second test signal line onto the base; an output terminal of the third test unit is coupled to the first test signal line and the second test signal line, and is configured to output same functional test signals to the first test signal line and the second test signal line simultaneously.

8. The display substrate according to claim 7, wherein the second test signal line comprises: an eighth conductive pattern, a ninth conductive pattern, a tenth conductive pattern, and an eleventh conductive pattern that are sequentially coupled;
    the first part of the second test signal line comprises the eighth conductive pattern and the tenth conductive pattern, and the second part of the second test signal line comprises the ninth conductive pattern and the eleventh conductive pattern;
    a third accommodating space is defined by the eighth conductive pattern, the ninth conductive pattern, the tenth conductive pattern and the first test signal line, and at least part of the third test unit is in the third accommodating space.

9. The display substrate according to claim 1, wherein the plurality of test signal lines further comprise a third test signal line and a fourth test signal line, the third test signal line comprises a third part extending in in the first direction and a fourth part extending in the second direction, and the fourth test signal line extends in the second direction;
    a width, of the fourth part of the third test signal line, in a direction perpendicular to the second direction is different from a width, of the fourth test signal line, in the direction perpendicular to the second direction;

among the first test signal line, the second test signal line, the third test signal line and the fourth test signal line, a difference between resistances of any two test signal lines is less than a first threshold.

10. The display substrate according to claim 9, wherein the first test signal line, the second test signal line, the third test signal line, and the fourth test signal line are arranged along the first direction in sequence; the test circuit comprises a first corner area, a second corner area and a third corner area, and the second test signal line comprises the first part and the second part in each of the first corner area, the second corner area and the third corner area; and the third test signal line comprises the third part and the fourth part in each of the second corner area and the third corner area.

11. The display substrate according to claim 9, wherein a width, of the third part of the third test signal line, in a direction perpendicular to the first direction is the same as the width of the fourth test signal line in the direction perpendicular to the second direction;
wherein the width of the third part of the third test signal line in the direction perpendicular to the first direction is smaller than a width, of the fourth part of the third test signal line, in the direction perpendicular to the second direction;
the width of the fourth test signal line in the direction perpendicular to the second direction is smaller than the width of the fourth part of the third test signal line in the direction perpendicular to the second direction.

12. The display substrate according to claim 9, wherein the test circuit further comprises a first test sub-circuit, and the first test sub-circuit comprises:
a fourth test unit, wherein an orthographic projection of the fourth test unit onto a base of the display substrate is between an orthographic projection of the second test signal line onto the base and an orthographic projection of the third test signal line on the base; an output terminal of the fourth test unit is coupled to the third test signal line, and is configured to output a first image test signal and a second image test signal to the third test signal line in a time division manner;
a fifth test unit, wherein an orthographic projection of the fifth test unit onto the base is between the orthographic projection of the third test signal line onto the base and an orthographic projection of the fourth test signal line onto the base; an output terminal of the fifth test unit is coupled to the fourth test signal line, and is configured to output a third image test signal to the fourth test signal line.

13. The display substrate according to claim 12, wherein the test circuit further comprises a second test sub-circuit, and the second test sub-circuit comprises:
a sixth test unit, wherein an orthographic projection of the sixth test unit onto the base is between the orthographic projection of the third test signal line onto the base and the orthographic projection of the fourth test signal line onto the base; an output terminal of the sixth test unit is coupled to the third test signal line and the fourth test signal line, and is configured to output same functional test signals to the third test signal line and the fourth test signal line simultaneously.

14. The display substrate according to claim 13, wherein the third test signal line comprises a twelfth conductive pattern, a thirteenth conductive pattern, a fourteenth conductive pattern, a fifteenth conductive pattern, a sixteenth conductive pattern, a seventeenth conductive pattern, an eighteenth conductive pattern, a nineteenth conductive pattern and a twentieth conductive pattern that are sequentially coupled; the third part of the third test signal line comprises the thirteenth conductive pattern, the fifteenth conductive pattern, the seventeenth conductive pattern and the nineteenth conductive pattern, and the fourth part of the third test signal line comprises the twelfth conductive pattern, the fourteenth conductive pattern, the sixteenth conductive pattern, the eighteenth conductive pattern and the twentieth conductive pattern; a second accommodating space is defined by the fifteenth conductive pattern, the sixteenth conductive pattern, the seventeenth conductive pattern, and the second test signal line, and at least part of the second test unit is in the second accommodating space; a fifth accommodating space is defined by the thirteenth conductive pattern, the fourteenth conductive pattern, the fifteenth conductive pattern and the fourth test signal line, and at least part of the fifth test unit is in the fifth accommodating space; a sixth accommodating space is defined by the nineteenth conductive pattern, the twentieth conductive pattern and the fourth test signal line, and at least part of the sixth test unit is in the sixth accommodating space.

15. The display substrate according to claim 1, wherein the test structure further comprises: a first control signal line, a second control signal line, a third control signal line, a fourth control signal line, a fifth control signal line, a sixth control signal line and a seventh control signal line that all extend in the first direction; and a first test data line, a second test data line, a third test data line, a fourth test data line, a fifth test data line, a sixth test data line, a seventh test data line and an eighth test data line that all extend in the first direction;
the plurality of test signal lines further comprises a third test signal line and a fourth test signal line;
each of the test circuits comprises a first test sub-circuit and a second test sub-circuit; the first test sub-circuit comprises a first test unit, a second test unit, a fourth test unit and a fifth test unit; the second test sub-circuit comprises a third test unit and a sixth test unit;
the first test unit comprises a first transistor and a second transistor, a gate of the first transistor is coupled to the second control signal line, a first electrode of the first transistor is coupled to the third test data line, and a second electrode of the first transistor is coupled to the first test signal line;
a gate of the second transistor is coupled to the third control signal line, a first electrode of the second transistor is coupled to the fourth test data line, and a second electrode of the second transistor is coupled to the first test signal line;
the second test unit comprises a third transistor, a gate of the third transistor is coupled to the fifth control signal line, a first electrode of the third transistor is coupled to the sixth test data line, and a second electrode of the third transistor is coupled to the second test signal line;
the fourth test unit comprises a fourth transistor and a fifth transistor, a gate of the fourth transistor is coupled to the first control signal line, a first electrode of the fourth transistor is coupled to the first test data line, and a second electrode of the fourth transistor is coupled to the third test signal line;
a gate of the fifth transistor is coupled to the second control signal line, a first electrode of the fifth transistor is coupled to the second test data line, and a second electrode of the fifth transistor is coupled to the third test signal line;
the fifth test unit comprises a sixth transistor, a gate of the sixth transistor is coupled to the fourth control signal line, a first electrode of the sixth transistor is coupled to the fifth test data line, and a second electrode of the sixth transistor is coupled to the fourth test signal line;

the third test unit comprises a seventh transistor and an eighth transistor, a gate of the seventh transistor and a gate of the eighth transistor are both coupled to the sixth control signal line, a first electrode of the seventh transistor and a first electrode of the eighth transistor are both coupled to the seventh test data line, a second electrode of the seventh transistor is coupled to the first test signal line, and a second electrode of the eighth transistor is coupled to the second test signal line;

the sixth test unit comprises a ninth transistor and a tenth transistor, a gate of the ninth transistor and a gate of the tenth transistor are both coupled to the seventh control signal line, a first electrode of the ninth transistor and a first electrode of the tenth transistor are both coupled to the eighth test data line, a second electrode of the ninth transistor is coupled to the third test signal line, and a second electrode of the tenth transistor is coupled to the fourth test signal line.

16. A method for driving the display substrate according to claim 15, wherein the first test data line and the third test data line are configured to transmit the first image test signal; the second test data line and the fourth test data line are configured to transmit the second image test signal; the fifth test data line and the sixth test data line are configured to transmit the third image test signal; the seventh test data line and the eighth test data line are configured to transmit the functional test signals;

the method comprises:

in a first test stage, under the control of a second control signal transmitted by the second control signal line, the first transistor is turned on, to write the first image test signal transmitted by the third test data line into the first test signal line; under the control of a first control signal transmitted by the first control signal line, the fourth transistor is turned on, to write the first image test signal transmitted by the first test data line into the third test signal line; under the control of a fifth control signal transmitted by the fifth control signal line, the third transistor is turned on, to write the third image test signal transmitted by the sixth test data line into the second test signal line;

in a second test stage, under the control of a third control signal transmitted by the third control signal line, the second transistor is turned on, to write the second image test signal transmitted by the fourth test data line into the first test signal line; under the control of a second control signal transmitted by the second control signal line, the fifth transistor is turned on, to write the second image test signal transmitted by the second test data line into the third test signal line; under the control of a fourth control signal transmitted by the fourth control signal line, the sixth transistor is turned on, to write the third image test signal transmitted by the fifth test data line into the fourth test signal line;

in a third test stage, under the control of a sixth control signal transmitted by the sixth control signal line, the seventh transistor and the eighth transistor are turned on, to write the functional test signal transmitted by the seventh test data line into the first test signal line and the second test signal line; under the control of a seventh control signal transmitted by the seventh control signal line, the ninth transistor and the tenth transistors are turned on, to write the functional test signal transmitted by the eighth test data line into the third test signal line and the fourth test signal line.

17. The display substrate according to claim 1, further comprising:

a plurality of data signal lines in the display area, wherein the data signal lines respectively correspond to the test signal lines;

a plurality of fanout lines in the non-display area, wherein the fanout lines respectively correspond to the data signal lines, and the data signal line is coupled to the corresponding test signal line through the corresponding fanout line; the plurality of fanout lines form a plurality of sub-fanout areas arranged along the first direction, and each of the plurality of sub-fanout areas comprises fanout lines;

a plurality of power signal line patterns, wherein an orthographic projection of each power signal line pattern onto a base of the display substrate is between orthographic projections of two adjacent sub-fanout areas onto the base; resistances of the fanout lines on a same side of a central axis of the display substrate gradually increase along a direction towards the central axis, a difference between resistances of any two adjacent fanout lines is smaller than a second threshold, and the central axis extends in a direction parallel to the second direction.

18. The display substrate according to claim 17, wherein at least one fanout line comprises a first fanout pattern and a second fanout pattern that are coupled, the first fanout pattern is between the display area and the second fanout pattern, the first fanout pattern extends in the second direction, the second fanout pattern extends in a third direction, and the third direction intersects the second direction;

on a same side of the central axis and along the direction towards the central axis of the display substrate, widths of the first fanout patterns of the fanout lines in a same sub-fanout area gradually increase, and widths of the second fanout patterns of the fanout lines in the same sub-fanout area are the same;

on a same side of the central axis, for two adjacent sub-fanout areas, a width of the first fanout pattern that is farthest from the central axis in the sub-fanout area closer to the central axis, is greater than, a width of the first fanout pattern that is closest to the central axis in the sub-fanout area farther away from the central axis; a difference, between the width of the first fanout pattern that is farthest from the central axis in the sub-fanout area closer to the central axis and the width of the first fanout pattern that is closest to the central axis in the sub-fanout area farther away from the central axis, is greater than a third threshold;

the width of the first fanout pattern is a width of the first fanout pattern in the direction perpendicular to the second direction, and the width of the second fanout pattern is a width of the second fanout pattern in the direction perpendicular to the third direction.

19. A display device, comprising the display substrate according to claim 1.

20. A manufacturing method of a display substrate, for manufacturing the display substrate according to claim 1, wherein the manufacturing method comprises:

manufacturing a test structure in a non-display area of the display substrate, wherein the test structure comprises a plurality of test circuits arranged along a first direction, and each of at least one test circuit of the plurality of test circuits comprises: a plurality of test signal lines, wherein the plurality of test signal lines comprises a first test signal line and a second test signal line, the first test signal line extends in a second direction, the second test signal line comprises a first part extending in the first direction and a second part extending in the second direction, and the second direction intersects the first direction; wherein a width, of the second part of the second test signal line, in a direction perpendicular to the second direction is different from a width, of the first test signal line, in the direction perpendicular to the second direction, and a difference between a resistance of the first test signal line and a resistance of the second test signal line is smaller than a first threshold.

* * * * *